(12) United States Patent
Montcalm et al.

(10) Patent No.: US 6,668,207 B1
(45) Date of Patent: Dec. 23, 2003

(54) METHOD AND SYSTEM USING POWER MODULATION AND VELOCITY MODULATION PRODUCING SPUTTERED THIN FILMS WITH SUB-ANGSTROM THICKNESS UNIFORMITY OR CUSTOM THICKNESS GRADIENTS

(75) Inventors: Claude Montcalm, Livermore, CA (US); James Allen Folta, Livermore, CA (US); Christopher Charles Walton, Berkeley, CA (US)

(73) Assignee: The United States of America, Washington, DC (US)

( * ) Notice: Subject to any disclaimer, the term of this patent is extended or adjusted under 35 U.S.C. 154(b) by 512 days.

(21) Appl. No.: 09/710,957

(22) Filed: Nov. 13, 2000

Related U.S. Application Data

(63) Continuation-in-part of application No. 09/454,673, filed on Dec. 3, 1999.

(51) Int. Cl.$^7$ .............................................. G06F 19/00
(52) U.S. Cl. .................... 700/121; 700/116; 204/192.13
(58) Field of Search ................................ 700/121, 116, 700/123, 108; 204/192.15, 198.03; 118/663

(56) References Cited

U.S. PATENT DOCUMENTS

| | | | | |
|---|---|---|---|---|
| 4,858,556 A | | 8/1989 | Siebert | 118/664 |
| 5,240,583 A | | 8/1993 | Ahonen | 204/298.04 |
| 5,689,426 A | * | 11/1997 | Kemeny et al. | 700/157 |
| 5,893,050 A | * | 4/1999 | Park et al. | 702/97 |
| 5,911,856 A | | 6/1999 | Suzuki et al. | 204/192.13 |
| 5,911,858 A | | 6/1999 | Ruffner | 204/192.27 |
| 5,943,230 A | * | 8/1999 | Rinnen et al. | 700/18 |
| 6,010,600 A | | 1/2000 | Vernon et al. | 204/192.11 |
| 6,270,862 B1 | * | 8/2001 | McMillin et al. | 427/569 |

OTHER PUBLICATIONS

"The Interactive Data Language," by Research Systems, Inc., downloaded from Internet (http://www.rsinc.com/idl/index.cfm) on Aug. 2, 1993 (3 pages).

"Multilayer Coatings of 10X Projection Optics for Extreme Ultraviolet Lithography," C. Montcalm, et al., Emerging Lithographic Technologies III, Mar. 15–17, 1999 SPIE Proceedings Series, vol. 3676, pp. 710–716.

(List continued on next page.)

Primary Examiner—Leo Picard
Assistant Examiner—Kidest Bahta
(74) Attorney, Agent, or Firm—Sierra Patent Group, Ltd.

(57) ABSTRACT

A method and system for determining a source flux modulation recipe for achieving a selected thickness profile of a film to be deposited (e.g., with highly uniform or highly accurate custom graded thickness) over a flat or curved substrate (such as concave or convex optics) by exposing the substrate to a vapor deposition source operated with time-varying flux distribution as a function of time. Preferably, the source is operated with time-varying power applied thereto during each sweep of the substrate to achieve the time-varying flux distribution as a function of time. Preferably, the method includes the steps of measuring the source flux distribution (using a test piece held stationary while exposed to the source with the source operated at each of a number of different applied power levels), calculating a set of predicted film thickness profiles, each film thickness profile assuming the measured flux distribution and a different one of a set of source flux modulation recipes, and determining from the predicted film thickness profiles a source flux modulation recipe which is adequate to achieve a predetermined thickness profile. Aspects of the invention include a computer-implemented method employing a graphical user interface to facilitate convenient selection of an optimal or nearly optimal source flux modulation recipe to achieve a desired thickness profile on a substrate. The method enables precise modulation of the deposition flux to which a substrate is exposed to provide a desired coating thickness distribution.

50 Claims, 5 Drawing Sheets

OTHER PUBLICATIONS

"*Multilayer Coating of 10X Projection Optics for Extreme–Ultraviolet Lithography*," C. Montcalm, et al., presented at the SPIE Conference on Microlithography—Emerging Lithographic Technologies III, at Santa Clara, California, Mar. 14–19, 1999 (12 pages).

"*Advances in Multilayer Reflective Coatings for Extreme–Ultraviolet Lithography*," James A. Folta, et al., Emerging Lithographic Technologies III, Mar. 15–17, 1999 SPIE Proceedings Series, vol. 3676, pp. 702–709.

"*Advances in Multilayer Reflective Coatings for Extreme–Ultraviolet Lithography*," James A. Folta, et al., presented at the SPIE Conference on Microlithography—Emerging Lithographic Technologies III, at Santa Clara, California, during Mar. 14–19, 1999 (12 pages).

"*Multilayer Reflective Coatings for Extreme–Ultraviolet Lithography*," C. Motcalm, et al., proceedings of the SPIE Conference on Microlithography—Emerging Lithographic Technologies II, at Santa Clara, California, Feb. 23–25, 1998 SPIE Proceedings Series, vol. 3331, pp. 42–51.

"*$Ni/B_4C$ Graded Multilayers for X–Ray Applications*," by Morawe, et al., (English language abstract distributed at Workshop on *Nanometer–scale Methods in X–Ray Technology* (*NSMXT*), Oct. 6–9, 1997, Costa da Caparica, Portugal.).

"*Design and Performance of Graded Multilayers as Focusing Elements for X–Ray Optics*," Morawe, et al., *Review of Scientific Instruments*, vol. 70, No. 8, Aug. 1999, pp. 3227–3232.

* cited by examiner

METHOD AND SYSTEM USING POWER MODULATION AND VELOCITY MODULATION PRODUCING SPUTTERED THIN FILMS WITH SUB-ANGSTROM THICKNESS UNIFORMITY OR CUSTOM THICKNESS GRADIENTS

CROSS-REFERENCE TO RELATED APPLICATION

The present application is a continuation-in-part of U.S. application Ser. No. 09/454,673, filed Dec. 3, 1999, by J. A. Folta, C. Montcalm, and C. Walton, the full text of which is hereby incorporated herein by reference.

BACKGROUND OF THE INVENTION

1. Field of the Invention

The invention relates to methods and apparatus for producing thin films on substrates by vapor deposition (e.g., sputtering). The invention pertains to improving the accuracy of the deposited film thickness across the substrate (e.g., by improving the uniformity of the film thickness across the substrate where it is desired to deposit a film having uniform thickness). The invention presents the particular advantage of avoiding the use of apertures or masks to tailor the deposition profile.

2. Discussion of the Related Art

Thin film coatings are typically produced by various vapor deposition methods (such as sputtering, chemical vapor deposition (CVD), electron beam evaporation, thermal evaporation, and ion beam plating) in which the substrate to be coated is passed through a vapor of the coating material and accumulates a thin film through condensation of the vapor. For many applications, such as optical films for EUV (extreme ultraviolet) lithography, it is desirable that the coating be very uniform in thickness (e.g., with no more than 0.1% variation in thickness across the coated substrate). Multilayer coatings for EUV optics are commonly applied using DC magnetron sputtering.

FIG. 1 is a side cross-sectional view of a DC magnetron sputtering system, and FIG. 2 is a cross-sectional view of the FIG. 1 system taken along line 2—2 of FIG. 1. The system of FIGS. 1 and 2, described in U.S. Pat. No. 6,010,600, issued Jan. 4, 2000, to Vernon and Ceglio (assigned to the assignee of the present application), includes housing 10 (which has a cylindrical sidewall) and two rectangular sources (of sputtered atoms) located 180 degrees apart (relative to the system's vertical central axis through the center of shaft 6) at opposite sides of housing 10. One source is surrounded by chimney 2; the other is surrounded by chimney 2A. Chimneys 2 and 2A limit the deposition zone for each source (in which sputtered atoms can be deposited on substrate 11 or 12) to the area directly above the target (3 or 3A) of each source. The two substrates (11 and 12) are held face down on rotatable platter 5 above the sources, at locations 90 degrees apart with respect to the axis of shaft 6.

Multilayers (alternating layers of two different materials) can be deposited on each of substrates 11 and 12 by sweeping the substrates across the sources (by controlled rotation of shaft 6 and hence platter 5 relative to the stationary housing 10 and the stationary sources).

More specifically, the system of FIGS. 1 and 2 includes a first source comprising magnetron 1, chimney 2, and target 3 positioned within chimney 2 in the electric and magnetic fields produced by element 1 (such that ions present within chimney 2, e.g., ions created within chimney 2, will accelerate toward and be incident on target 3). In response to collisions of the ions (which can be argon ions) with target 3, a vapor of sputtered atoms 4 is produced in the volume surrounded by chimney 2. Some of atoms 4 will be deposited on the downward-facing surface of substrate 11 (or 12), when the substrate (11 or 12) is exposed to sputtered atoms 4 in chimney 2.

Similarly, the system also includes a second source comprising magnetron 1A, chimney 2A, and target 3A positioned within chimney 2A in the electric and magnetic fields produced by element 1A (such that ions created within chimney 2A will accelerate toward and be incident on target 3A). In response to collisions of the ions with target 3A, a vapor of sputtered atoms 4A is produced in the volume surrounded by chimney 2A. Some of atoms 4A will be deposited on the downward-facing surface of substrate 11 (or 12), when the substrate (11 or 12) is exposed to sputtered atoms 4A in chimney 2A.

Each of two substrate holders 9 (only one of which is visible in FIG. 1) is fixedly mounted to the lower end of one of shafts 8 (only one of which is visible in FIG. 1) so as to fit in an orifice extending through platter 5. Substrate 11 is mounted on substrate holder 9, with a downward facing surface to be coated. Shaft 8 is rotatably connected to spinner 7, so that spinner 7 can cause shaft 8, holder 9, and substrate 11 to rotate as a unit relative to platter 5, whether or not platter 5 is itself rotating relative to housing 10. Similarly, substrate 12 (shown in FIG. 2 only) is mounted on a substrate holder 9 (not visible in FIGS. 1 and 2) in turn fixedly mounted to a shaft 8, and the shaft is rotatably connected to a spinner (identical to spinner 7). During operation, elements 1, 2, 3, 1A, 2A, and 3A remain stationary within housing 10, while platter 5 rotates to sweep substrates 11 and 12 sequentially across chimneys 2 and 2A (typically while substrates 11 and 12 are rotated about their centers by the spinners relative to platter 5).

To deposit typical multilayer coatings on the substrates, atoms 4 (in chimney 2) are different (i.e., have a different atomic weight) than atoms 4A in chimney 2A. In some implementations, atoms 4 are Molybdenum atoms and atoms 4A are silicon (or beryllium) atoms (and magnetrons 1 and 1A produce a plasma of ultrapure Argon ions at a pressure of about 1.00 mTorr, with source powers of 360 W and 170 W, respectively, for magnetrons 1A and 1). Platter 5 is rotated within housing 10 (at a first rotational speed) while each substrate spins (at a speed much greater than the first rotational speed) relative to platter 5. During each revolution of platter 5 relative to housing 10, each of substrates 11 and 12 sweeps sequentially across chimney 2 and chimney 2A, so that one layer of atoms 4 and then one layer of atoms 4A condenses on each substrate. The thickness of each layer is determined by the time that the substrate is exposed to the vapor (4 or 4A), which is in turn determined by the substrate transit velocity. The arrangement of substrates 11 and 12 and chimneys 2 and 2A is such that no more than one substrate is over one source at any time. Therefore, the two substrates can be independently coated with identical or completely different multilayer structures.

By rapidly spinning substrate 11 (or 12) about its own axis of symmetry relative to platter 5, good azimuthal uniformity of the condensed coating can be achieved. However, radial non-uniformities in coating thickness typically result.

Spatially graded thin film coatings are typically obtained with carefully shaped masks, or apertures, inserted between the sources and substrates. A different mask is required for each source-substrate combination. The masking operation requires iteration of the shape of the mask, and can be impractical for cases where perfect thickness distribution control is required at the location that coincides with the axis of rotation. At best, this is a tedious and inefficient process that is inappropriate for a robust manufacturing technique. The use of masks or baffles also lacks flexibility when several substrates must be coated in the same deposition run using several deposition sources. If differently customized masks are attached in close proximity to the substrates to intercept part of the incident deposition flux, custom coating gradients can be obtained for each substrate but one cannot independently control the flux emitted by each source. On the other hand, if differently customized masks are installed over the sources to shape the outgoing deposition flux, customized coating gradients can be obtained from each source but one cannot independently control the coating gradients deposited on several different substrates. Finally, since the source distribution flux can change over time as the source or target is consumed, the mask shape may require modification. This would require another mask fabrication and perhaps venting the chamber to atmosphere (undesirable) to install the new mask. As will be apparent from the description below, the present invention avoids use of baffles or masks, allows independent deposition of two different coating distributions on a substrate as the substrate sweeps sequentially across two sources during a single platter rotation, and also allows independent deposition of different coating distributions on several substrates coated in the same deposition run, each of which sweeps sequentially across a source.

U.S. Pat. No. 6,010,600, issued Jan. 4, 2000, to Vernon and Ceglio and U.S. patent application Ser. No. 09/454,673 by Walton, Montcalm and Folta disclose a technique for improving thickness distribution control during vapor deposition and circumvents the noted limitations of conventional masking methods. Instead of masking areas of the source flux, an optimal (or nearly optimal) substrate sweep velocity recipe is determined and the substrate is swept through the deposition zone with a time-varying sweep velocity specified by such recipe. An aspect of the technique is a computer-implemented method for calculating the optimal (or nearly optimal) substrate sweep velocity recipe for obtaining the desired thickness distribution profile, using the measured flux profile from each source as input. The technique disclosed in the parent application is specific to systems in which a substrate moves with time-varying sweep velocity across one or more stationary sources (or in which each source moves with time-varying sweep velocity relative to a stationary substrate), each of the sources emitting a fixed deposition flux. The inventors of the present invention, however, have recognized that it can be difficult to engineer and control such systems in which a load of multiple, heavy substrates (or vapor deposition sources) must be precisely accelerated and decelerated to various velocities within very short distances. The requirements for acceleration/ deceleration of heavy substrates can significantly complicate the design of the substrates' drive mechanism and increase the cost of the vapor deposition tool.

An important aspect of the present invention is another maskless approach for the production of laterally graded or uniform thin film coatings on arbitrarily shaped substrates, in which one modulates the power applied to each source (or otherwise modulates the flux distribution of each source) instead of modulating the sweep velocity of the substrate relative to each source (or of each source relative to the substrate). The present invention has all the advantages of the velocity modulation method described in the parent application (over conventional masking methods), while eliminating the need for special mechanical drive requirements for modulating substrate (or source) sweep velocity.

Until the present invention, it had not been known how to achieve deposited coating thickness uniformity of better than 0.1% across typical substrates, or how to achieve coating thickness having a precisely predetermined graded (nonuniform) profile across typical substrates (including curved substrates such as EUV optics as well as flat substrates), without the need for modulating substrate (or source) sweep velocity.

Prior to the present invention, it had been known to set the power applied to a vapor deposition source to achieve a desired flux distribution (a desired thickness per unit of time of a layer deposited on a substrate held fixed relative to the source). It had also been known to apply a level of power to a vapor deposition source which determines a desired flux distribution of source, which in turn determines a nominal thickness of a layer (e.g., a thin film or one layer of a multilayer coating) deposited by the source on a spinning substrate during a sweep (with fixed velocity) of the spinning substrate across the source. However, until the present invention it had not been proposed to modulate the power applied to a vapor deposition source (or otherwise to modulate the flux distribution of such a source) while sweeping a spinning substrate across the source, in order to deposit on the substrate a layer having a desired thickness distribution profile.

It is expected that the invention will be useful in many applications, including precise deposition of laterally uniform or graded optical interference thin film coatings for EUV lithography, EUV optics, lithography masks, and optical coatings for general applications such as optical communication networks, microscopy, astronomy, and spectroscopy, production of specifically graded coatings on curved optical elements, precise modification of the surface figure of optical elements for fabrication of aspheric optics, and production of extremely uniform films for semiconductor or magnetic recording devices.

SUMMARY OF THE INVENTION

In preferred embodiments, the invention is a method and system for determining a source flux modulation recipe for achieving a selected thickness profile of a film to be deposited (e.g., with highly uniform or highly accurate custom graded thickness) over a substrate surface by exposing the substrate to a region containing a vapor of the coating substance (referred to as a vapor deposition "source" of coating material) in which the flux density is controlled. In preferred embodiments, the controlled flux density of the source is determined in accordance with the invention by:

calculating a set of predicted film thickness profiles, each film thickness profile assuming a substrate (spinning at a fixed rate) that sweeps across a source (preferably with a constant sweep velocity but alternatively with time-varying sweep velocity) whose flux distribution is controlled according to different one of a set of source flux modulation recipes (each source flux modulation recipe specifying source flux distribution as a function of time during a time interval in which the substrate sweeps across the source); and then, determining an optimal (or nearly optimal) source flux modulation recipe to achieve a desired thickness profile (typically by selecting the source flux modulation recipe which corresponds to the predicted film thickness profile which best matches the desired thickness profile).

Typically, each source flux modulation recipe is a power modulation recipe specifying the power applied to the source as a function of time during the time interval in which the substrate sweeps across the source. A thin film having the desired thickness profile can be deposited on a substrate surface by sweeping the substrate across the source while the source flux distribution is controlled in accordance with the optimal source flux modulation recipe.

Preferably, the method includes (and the system is configured to perform) the steps of measuring the flux distribution of the source (resulting from application of each of a number of different power levels to the source) by holding a test piece stationary in a position exposed to the source while a first fixed power level is applied to the source and measuring the deposited layer thickness as a function of position on the test piece, holding another test piece stationary in a position exposed to the source while a second fixed power level is applied to the source and measuring the deposited layer thickness as a function of position on the test piece, repeating the latter step for each additional fixed power level to be applied to the source, and calculating each of the predicted film thickness profiles using each measured source flux distribution (assuming a different source flux modulation recipe for each predicted film thickness profile).

Alternately, the source flux distribution can be measured at only one power level, and other source fluxes can be estimated by assuming a linear dependence of flux with power.

The inventive method for calculating what source flux modulation recipe is needed to give a desired thickness profile on the substrate is applicable not only to flat substrates, but also to both concave and convex curved optics (i.e., optics having nonzero curvature).

Preferably, a computer is programmed to process measured flux distribution data (for a given source or set of sources) to generate a set of predicted coating thickness profiles, each corresponding to a different source flux (or source flux and substrate sweep velocity) function, and to allow the user to conveniently determine an optimal source flux function (or source flux and substrate sweep velocity function) for achieving a predetermined coating thickness profile on each substrate. In general, each source flux function specifies how the flux distribution of the source varies over time (while the substrate sweeps across the source with constant velocity). Each source flux and substrate sweep velocity function specifies the variation over time of both the flux distribution of the source, and the velocity with which the substrate sweeps across the source.

In preferred implementations, the computer is programmed to have a user interface which displays predicted peak-to-valley coating thickness error for each of a number of source flux functions (preferably in the form of a contour map), and a cursor. By manipulating an input device (e.g., a mouse) the user can select any of a number of points on the thickness error display, and in response to each selected point, the computer displays a graph of predicted coating thickness as a function of position on the substrate (for the corresponding source flux function). By inspecting the displayed graph for each of several points on the thickness error display, the user can conveniently determine an optimal source flux function (for achieving a predetermined coating thickness profile on the substrate).

The inventors have recognized that slow spin speeds for the substrate (while the substrate is swept across the source) give rise to a ripple effect (rapid oscillation of coating thickness as a function of radius cross the substrate), which may or may not be acceptable for specific applications.

BRIEF DESCRIPTION OF THE DRAWINGS

FIG. 4 shows that the peripheral point's path 31 is very different from the center point's path 30.

DETAILED DESCRIPTION OF PREFERRED EMBODIMENT

Figure 1:
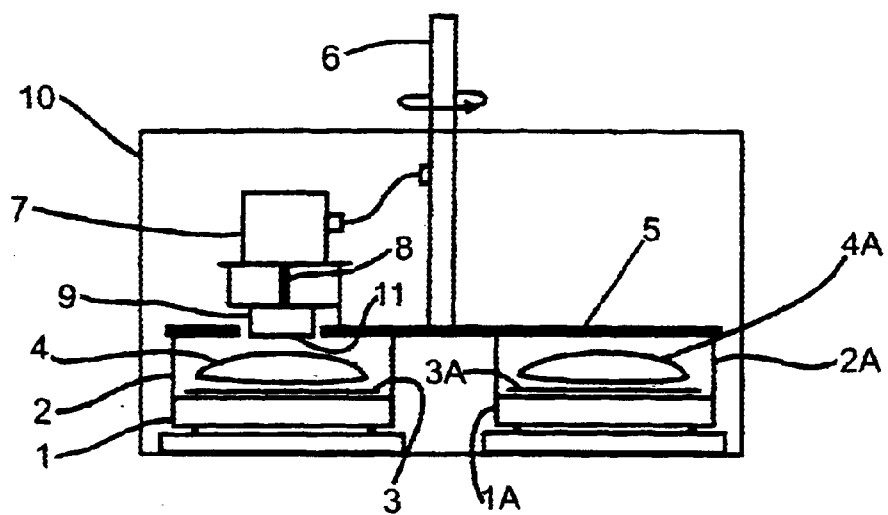
FIG. 1 is a side cross-sectional view of a conventional DC magnetron sputtering system.

The invention pertains to methods and systems for vapor deposition (such as sputtering, CVD, and electron beam evaporation methods and systems) in which a substrate to be coated is passed through a vapor of the coating material and accumulates a film (typically a very thin film) of the coating material through condensation of the vapor.

The invention provides a method producing uniform or graded thin film and multilayer coatings on substrates with any surface curvature in a manner avoiding use of apertures or masks to tailor the deposition flux profile. In accordance with the invention, the power applied to a vapor deposition source is modulated (or the flux distribution of the source is otherwise modulated) as one or more substrates sweep across the source with controlled velocity (preferably a constant velocity, but optionally a time-varying velocity) to generate a thicker or thinner coating in some substrate regions relative to other substrate regions. Typically, the substrate also spins relative to the source as it sweeps across the source.

The amount of coating deposited at a particular point on the surface of a substrate depends on the time this point is exposed to the deposition flux of a source and the intensity of this flux at that time, which, in turn, depends on the power applied to the source, the deposition flux distribution profile of the source (for the applied power), and the substrate geometry (distance of the point from the source and angle of the surface normal at the point relative to the source). If a coating is too thin at one edge of the substrate when the substrate passes over the source of a constant velocity, one can increase the power applied to the source (and therefore increase the deposition flux proportionally) while only that edge is exposed to the source. This results in thicker coatings in regions of the substrate coated at the higher power. Using this approach, complicated coating thickness distribution profiles can be obtained on substrates with various surface curvatures by using different power modulation recipes while the substrate is translated across the deposition zones. In preferred embodiments, the power applied to the source is computer controlled and an optimal (or nearly optimal) power modulation recipe is determined by executing a computer code. The motion of the substrate across the source can be linear or rotational, can consist of single or multiple passes per layer, and can be partial or complete. The substrate can be rotated around its center of mass to produce a radially symmetrical thickness profile, or another rotation axis can be selected to obtain other distributions. The present invention is applicable to any type of vapor deposition system in which each of one or more deposition sources is characterized by a deposition flux distribution.

There is a direct mapping between the coating thickness distribution and the substrate equation of motion and the deposition flux intensity (as a function of time) which is exploited in accordance with the invention to tailor the coating thickness distribution without the use of masks and apertures. A combination of both velocity modulation of the substrate and power modulation of the source can be used to produce the desired thickness distribution. An important advantage of fixing the substrate sweep velocity to a constant value is that this reduces considerably the engineering requirements of the substrate drive assembly (eliminating difficulties which would otherwise result in designing the substrate drive assembly to accelerate or decelerate heavy substrates with the required accuracy). Several different substrates can be coated with different thickness distribution profiles with several different deposition sources in a single deposition run, and only simple software changes (no hardware changes) for varying the recipe for modulating the power applied to the source (or otherwise modulating the sources' flux distribution as a function of time) are required to accommodate a change in a desired thickness distribution profile or a change in the deposition flux due to source aging.

In a preferred embodiment, the non-uniform flux distribution from each deposition source is measured at each of the different power levels that are likely to be required. One accurate flux distribution measurement method ("lift-off" with stylus profilometry) will be described below. Alternatively, theoretical models for predicting the flux of distribution may be used (without actually measuring the flux distribution at each power level) but may lack the required accuracy. Alternately, the non-uniform flux distribution can be measured at only a single power level and the distribution can then be assumed to vary linearly with power level. An algorithm is then developed and executed to numerically calculate the coating thickness distribution as a function of substrate equation of motion, substrate geometry, and deposition flux modulation recipe. From the calculated thickness distributions, the time during which each point on the substrate is exposed to a deposition flux of a given intensity is calculated, and the flux received at each such point is integrated to obtain the final thickness distribution. The model can but need not include the effect of the angular velocity of a spinning substrate or of a changing system configuration, such as those in which there is time variation of substrate tilt angles, height, and/or solid angle of exposure to the source. The invention allows precise thickness distribution control, with the power applied to each source being the primary process control variable, as a result of determining an optimal (or nearly optimal) power modulation recipe, which recipe is easily implemented with computer controls.

A first preferred embodiment of the invention will be described with reference to FIGS. 3–12, and another preferred embodiment of the invention will be described with reference to FIG. 3A.

Figure 2:
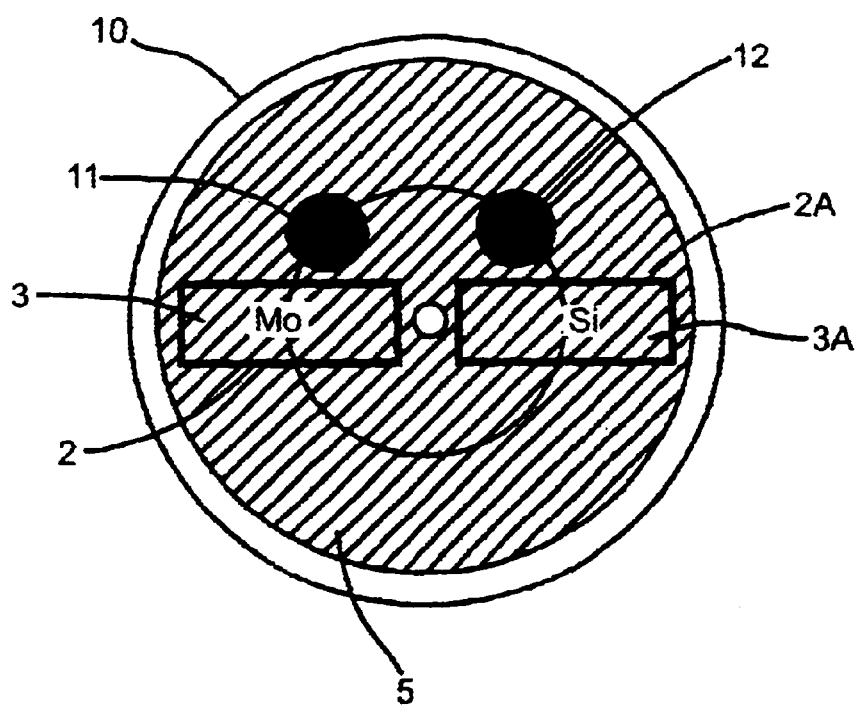
FIG. 2 is a cross-sectional view of the FIG. 1 system taken along line 2—2 of FIG. 1.
Figure 3A:
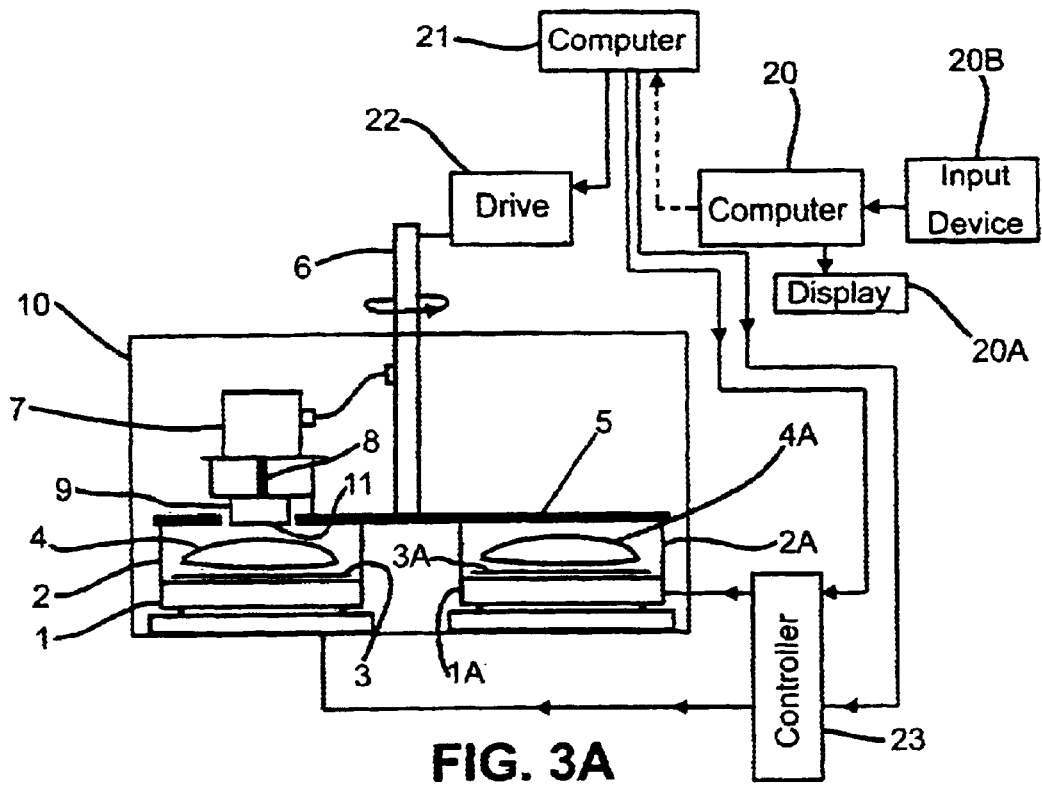
FIG. 3A is a side cross-sectional view of another DC magnetron sputtering system which embodies the invention, but which does not include a computer-controlled drive which rotates shaft 6 and platter 5 with time-varying velocity.
Figure 3B:
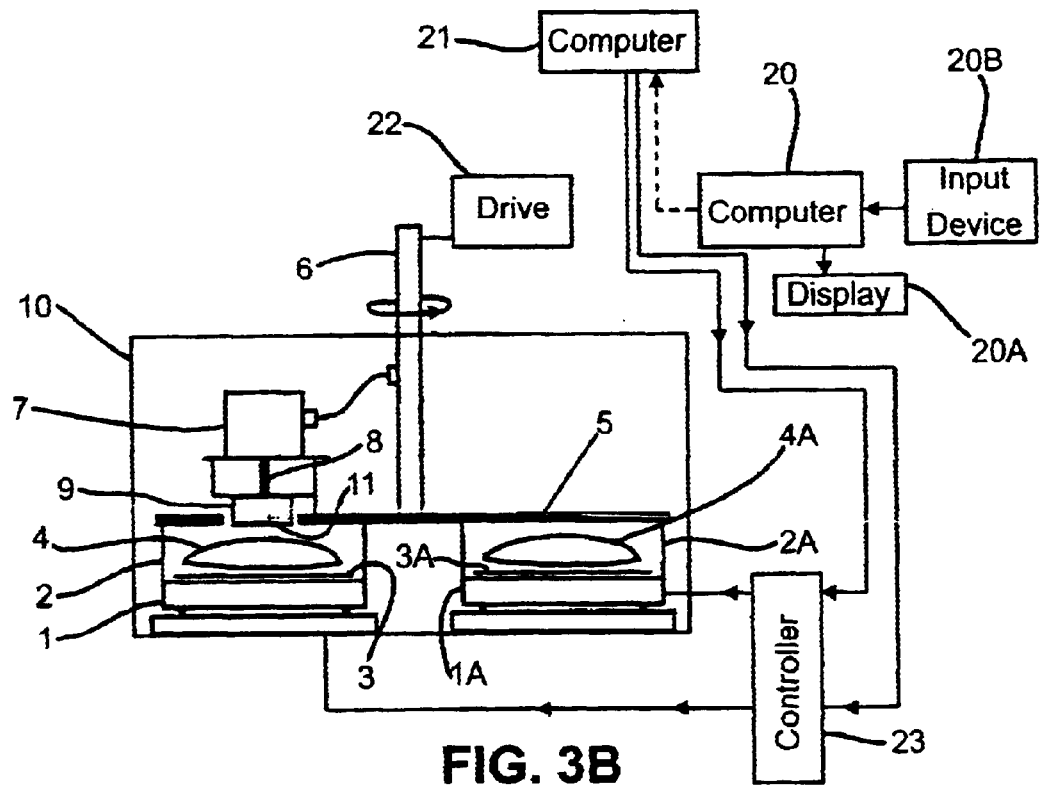
FIG. 3 is a side cross-sectional view of a DC magnetron sputtering system which embodies the invention.

FIG. 3 is a cross-sectional view of a DC magnetron sputtering system which embodies the invention. The FIG. 3 system differs from that of FIGS. 1 and 2 only in that it includes: computer 20, which includes a display device 20A and an input device 20B (e.g. a mouse), and which is programmed to process measured flux distribution data (to be described) to generate predicted coating thickness profiles (each corresponding to a different selected source flux function or "source flux and substrate sweep velocity" function) and to determine an optimal substrate sweep velocity (or source flux and substrate sweep velocity) function (for achieving a predetermined coating thickness profile on each substrate); computer 21; shaft drive unit 22 which is coupled to shaft 6 and computer 21 and configured to rotate shaft 6 with a time-dependent rotational speed (determined by control signals from computer 21) to implement a predetermined substrate sweep velocity function; and source controller 23 (coupled to magnetrons 1 and 1A and computer 21) which is configured to supply power to each magnetron in response to control signals from computer 21).

Each source flux function specifies how the flux distribution of the source varies over time (while the substrate sweeps across the source with constant velocity). Each source flux and substrate sweep velocity function specifies the variation over time of both the flux distribution of the source, and the velocity with which the substrate sweeps across the source.

Embodiments of the invention in which each predicted coating thickness profile corresponds to a source flux function preferably determine an optimal (or nearly optimal) source flux modulation recipe which specifies the control parameters for controlling the flux distribution of each source as a function of time during each time interval in which the substrate sweeps across the source. Typically, each source flux modulation recipe is a power modulation recipe specifying the power applied to each source as a function of time during each such time interval in which the substrate sweeps across the source. Embodiments of the invention in which each predicted coating thickness profile corresponds to a source flux and substrate sweep velocity function preferably determine an optimal (or nearly optimal) source flux and substrate sweep velocity modulation recipe which specifies the control parameters for controlling both the flux distribution of each source, and the substrate sweep velocity, as a function of time during each time interval in which the substrate sweeps across the source.

Computer 21 receives information (e.g., a source flux and substrate sweep velocity modulation recipe determined by computer 20) but need not be physically connected to computer 20 (e.g., a human operator can enter information determined by computer 20 to an input device of computer 201. Drive unit 22 can be coupled to computer 20 in addition to (or instead of) computer 21. Computer 21 is programmed to assert control signals for controlling rotation of shaft 6 in accordance with an optimal (or nearly optimal) source flux and substrate sweep velocity function determined by computer 20. Computer 20 can be programmed to determine the optimal source flux and substrate sweep velocity function, data indicative of the optimal source flux and substrate sweep velocity function can then be loaded into computer 21, and computer 21 can then generate and assert to drive unit 22 the control signals for controlling rotation of shaft 6 (and generate and assert to controller 23 control signals for controlling magnetrons 1 and 1A).

The FIG. 3 system can be used to perform the inventive method as follows: (a) the flux distribution of the first source (comprising elements 1, 2, and 3) is measured using a first test piece held stationary (by holder 9) at the first source (operated at fixed power); (b) the flux distribution of the second source (comprising elements 1A, 2A, and 3A) is measured 30 using a second test piece held stationary (by holder 9) at the second source (operated at fixed power); (c) step (a) is repeated (using a test piece similar or identical to the first test piece during each repetition, with the first source operated at a different fixed power during each repetition); (d) step (b) is repeated (using a test piece similar or identical to the second test piece during each repetition, with the second source operated at a different fixed power during each repetition); and (e) the measured data is processed by computer 20 to calculate the predicted thickness profile of a film layer deposited by either source (under each of several sweep velocity modulation recipes or source flux and sweep velocity modulation recipes). Typically, computer 20 is programmed to generate displays (on device 20A) of the predicted thickness profiles and corresponding recipes to allow a user to select a recipe corresponding to a desired thickness profile. Preferably, computer 20 is also programmed to determine for each source an optimal (or nearly optimal) sweep velocity modulation recipe (or source flux and sweep velocity modulation recipe) for achieving a user-specified (desired) thickness profile on a substrate as the substrate is swept across the source with constant or time-varying velocity while the source is controlled to have a time-varying source flux distribution determined by the recipe.

Preferably, the system is operated to deposit on a substrate a coating having the desired thickness profile as the substrate is swept across one of the sources with a constant or time-dependent velocity and a time-dependent source flux distribution determined by the optimal (or nearly optimal) profile. In some embodiments, a multilayer coating (comprising pairs of sequentially deposited layers each having a desired thickness profile) is deposited on a substrate that is swept sequentially across both sources with time-dependent velocity and time-dependent source flux distribution (during each transit across a source) determined by the optimal (or nearly optimal) profile, or a substrate that is swept sequentially across both sources with constant velocity and time-dependent source flux distribution determined by the optimal (or nearly optimal) profile.

More specifically, each source flux and substrate sweep velocity modulation recipe determines a first set of control parameters (e.g., power levels) for controlling the flux distribution of one of the sources (as a function of time) during each sweep of a substrate across the source, and a second set of control parameters for controlling the substrate sweep velocity (as a function of time) during each sweep of the substrate across the source. In response to user selection of a source flux and substrate sweep velocity modulation recipe (e.g., selection of an optimal recipe of this type) and loading of information indicative of this recipe to computer 21: computer 21 of FIG. 3 asserts the first set of control parameters to source controller 23, and controller 23 responds by controlling magnetron 1 (or 1A) to cause the source including such magnetron to have the desired time-varying source flux distribution during each sweep of the substrate; and computer 21 of FIG. 3 asserts the second set of control parameters to drive 22 to cause drive 22 to cause the substrate to sweep across the source with the desired time-varying velocity.

In the case of substrate sweeps in which shaft 6 is to rotate with constant angular velocity relative to a source, computer 21 is not needed, and each of a set of source flux modulation recipes determines a set of control parameters (e.g., power levels) for controlling the flux distribution of the source (as a function of time) during each sweep 25 across the source. In response to user selection of one of the source flux modulation recipes (e.g., selection of an optimal recipe of this type), computer 21 asserts the control parameters to source controller 23, and controller 23 responds by controlling magnetron 1 (or 1A) to cause the source including such magnetron to have the desired time-varying source flux distribution during a sweep of the substrate across the source.

The system of FIG. 3A is useful to implement sweeps in which shaft 6 rotates with constant angular velocity relative to each source. The FIG. 3A system is identical to that of FIG. 3, except in that computer 21 of FIG. 3A generates predicted thickness profiles in response to source flux modulation recipes rather than source flux and substrate sweep velocity modulation recipes. In response to user selection of a source flux modulation recipe, computer 21 of FIG. 3A asserts control parameters to drive 22 (to cause drive 22 to rotate shaft 6 with constant angular velocity) and additional control parameters to source controller 23. Controller 23 responds to the additional control parameters by controlling magnetron 1 (or 1A) to cause the source including such magnetron to have the desired time-varying source flux distribution during each sweep of the substrate (while drive 22 rotates shaft 6 with constant angular velocity). Shaft 8 of FIG. 3A can either cause the substrate to spin relative to platter 5, or it can hold the substrate fixed relative to platter 5 during each such sweep.

The flux distribution of each source of FIG. 3 or FIG. 3A is the thickness per unit of time of a layer deposited on a substrate held fixed relative to the source, as a function of position on the substrate. The step of measuring the flux distribution of either source is preferably performed as follows. A wafer is patterned (using photoresist/lithographic techniques) to have an array of features (preferably thin channels) in a layer of photoresist. The patterned wafer is mounted to platter 5 (i.e., substrate 11 of FIG. 3 or 3A is the patterned wafer in this embodiment), and a thick film is coated (by vapor deposition) on the patterned wafer as the wafer is held stationary over the source (and the source is operated at a fixed selected power). When the patterned wafer has been coated by the source, the vapor deposited material (e.g., sputtered material) is deposited in the channels (or other features) and on the photoresist. Next the photoresist is removed (via the conventional technique known as "lift-off"), leaving the sputtered material in the channels as an array of elevated features (a pattern comprising elevated features). The features are preferably thin lines, but they can alternatively have other shapes such as dots, dashes, or curves. The height of these elevated features is measured with high accuracy (i.e., to within about 10 Angstroms) with a profilometer (preferably a conventional mechanical profilometer).

Multiple measurements of the elevated feature heights over each large wafer gives a sampling of the deposition rate over the entire source. In the case of systems which include multiple sources (e.g., the system of FIG. 3 for producing multilayer films) the distribution of each sputter source is measured.

The advantage of using the above-described preferred method for measuring source flux distribution is that it measures flux distribution with excellent accuracy and with a large dynamic range (a commercially available profilometer can measure film thicknesses in a range from a few nm to 1000 nm, accurate to a few tenths of 1%). Other experimental methods for measuring flux distribution, such as by measuring optical transmission or conductivity of the deposited film could be used for some applications, but they are not sufficiently accurate over the range of vapor deposited layer thicknesses required for optical elements for use in EUV lithography, and typically do not allow measurement with a sufficient dynamic range. If the measured flux distribution is measured with insufficient accuracy, theoretical models for predicting vapor deposited film thickness profiles (assuming the measured flux distribution and assuming various source flux or source flux and sweep velocity recipes) will also lack the required accuracy.

Another aspect of the invention is a computer implemented method (performed in some embodiments by computer 20, or computers 20 and 21, of FIG. 3 or FIG. 3A) which implements a computational model using measured source flux distribution data as an input to predict the film thickness profile on a substrate that will result by using one vapor deposition source with the substrate being swept across the source according to any of a variety of source flux and sweep velocity modulation recipes (e.g., recipes for modulating the rotational velocity of platter 5 of FIG. 3 and the power supplied to magnetrons 1 and 1A as a function of time) or any of a variety of source flux modulation recipes (e.g., recipes for modulating the power supplied to magnetrons 1 and 1A as a function of time). In typical cases, the model assumes that the substrate spins (relative to the platter) about its center at constant speed (much faster than the substrate sweep speed) while the platter sweeps it across the source with constant (or time-varying) velocity and the power applied to the source is varied. However, we also contemplate performing the thickness profile calculation with a less stringent assumption, such as the assumption that the substrate spins with a selected time-varying speed while it is swept across the source or the assumption that the substrate does not spin (relative to the platter) during at least part of the time that it is swept across the source. The model (used by programmed computer 20 to perform the thickness profile calculation) should take into account the level of power applied to the source, the measured source flux distribution for such level of power applied to the source (which measured data must be input to the computer), the sweep velocity of the substrate's center across the source, and the angular velocity at which the substrate spins relative to the platter. By processing the inputs, the programmed computer calculates the trajectory of any point on the substrate over the source, and integrates the flux received at that point to obtain the final thickness. The calculation is repeated for different points on the substrate surface as needed, giving the final thickness profile.

Figure 4:
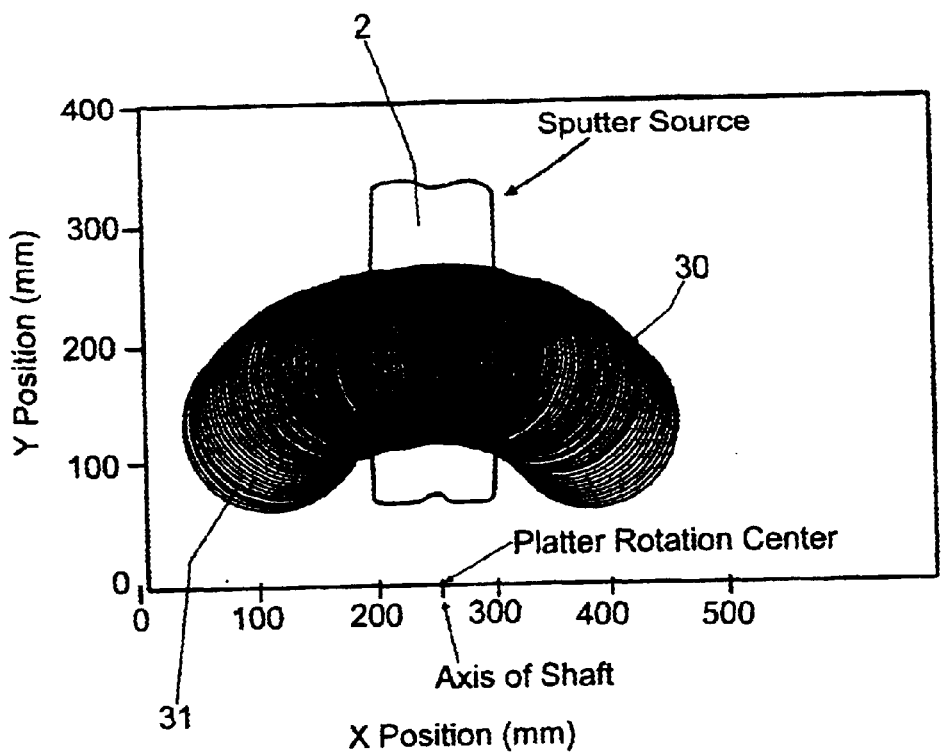
FIG. 4 is a diagram of the path (31) of a point on the periphery of disk-shaped substrate 11 of FIG. 3, and the path (30) of substrate 11's center, as the substrate translates across one of the sources of the FIG. 3 system (while the substrate spins about its center).

More specifically, in preferred embodiments, the computer is programmed in accordance with the invention to calculate a predicted thickness profile (a profile of predicted thickness of a film coating on the spinning substrate to be coated):

$$T(r,\phi) = \int \Phi(x, y, \Omega) d$$

where $T(r,\phi)$ is the film thickness at a point P (specified as $(r,\phi)$ on the spinning substrate; S is the path of the point P relative to the source; and $\Phi(x,y,\Omega)$ is sputtering rate of the source (referred to more generally herein as the flux distribution of the source) as a function of position over the source and as a function of the power $\Omega$ applied to source. $\Phi$ has units of Å/second, depends on the position over the source and the power applied to the source, is preferably measured in the manner described above, and is input to the computer prior to execution of a coating thickness profile calculation. With reference to FIG. 4, the flux distribution of source 2 is a magnitude (a coating thickness deposition rate) for each position (x, y) of the source (viewed as in FIG. 4) and for each moment in time t, and spiral path 31 represents the path S of a point P on the substrate (in FIG. 4, the point happens to be on the substrate's periphery). In this way, the above integral contains the sweep velocity recipe in the path S(t), and the source flux recipe in the power $\Omega(t)$.

For any point P on the substrate, the path S gives the position of the point P at any moment, and the above-noted integral for $T(r,\phi)$ simply multiplies the time that point P spends at each point over the source by the rate of film deposition there, and adds together all the resulting products to obtain the total thickness deposited at point P during the deposition run. The expression for path S contains the spin rate of the substrate, and the sweep velocity recipe which determines at what rate the spinning substrate is moved across the source. S is calculated as:

$$S(t) = \vec{r}_P(t) + \vec{r}_S(t).$$

The two r vectors ($r_s$ and $r_p$) are calculated as follows (resolving them into the (x,y) coordinates of the platter at the same time):

$$\vec{r}_S = r_S \cos(\omega t + \phi_0) \hat{x} + r_S \sin(\omega t + \phi_0) \hat{y}$$

which is the radius vector from the center of the substrate to the point P, where point P spins at $\omega$ rev/sec about the substrate's center beginning at angular position $\phi_0$, and $$\vec{r}_P(t) = r_P \cos \theta(t) \hat{x} + r_P \sin \theta(t) \hat{y}$$

which is the radius vector from the center of the platter to the center of the substrate. $\Theta(t)$ is the angular position of the platter over time (which has instantaneous rotational velocity $\omega_{platter}$), i.e., during the velocity modulation recipe.

The remaining problem for the code is to determine $\Theta(t)$. The sweep velocity recipe is preferably programmed into the control system as angular velocity (of the platter) vs. angle (with respect to the platter's initial angle of orientation at the start of a deposition run), or $$\frac{d\theta}{dt}(\theta) = f(\theta).$$

$\Theta(t)$ is determined from this by $$\frac{d\theta}{dt} = f(\theta) \rightarrow \frac{d\theta}{f(\theta)} = dt \rightarrow t = \int \frac{d\theta}{f(\theta)}$$

Defining $$F(\theta) = \int \frac{1}{f(\theta)} d\theta$$

then $t=F(\Theta)$ or $\Theta(t)=F^{-1}(t)$ which is the function desired.

Given a velocity recipe $(d\Theta)/dt)(\Theta)$, the code uses the described method to trace the path of the point at the center of the substrate ($r_S=0$) through one pass of the substrate over both sources (assuming two deposition sources comprising targets 3 and 3A for multilayer coatings as in FIG. 3: one for depositing Mo; the other for depositing Si). The programmed computer adds the thickness accumulated at each instant (over each source) to get the total thickness at $r_S=0$. The calculation is then repeated at $r_S=5$ mm, $r_S=10$ mm, or whatever interval is desired, and the result is the final thickness profile over the entire range of radial positions within the substrate. The starting angular position of the substrate, $\phi 0$, is usually held at zero, because the substrate spin $\omega$ is very rapid, and hence there is little dependence of the coating thickness on $\phi 0$. However, the model can just as easily be applied for a slow spin rate $\omega$, and in fact such calculations were done to verify that the spin rate $\omega$ being used was sufficiently high.

Solving for the coating thickness one point at a time by tracing that point's path over each substrate has a number of important advantages. Previous work on predicting thickness profiles (as explained, for example, in above-referenced U.S. Pat. No. 6,010,600) had treated the coating of a whole substrate as a single analytical integral. In contrast, the inventive approach allows consideration of finite substrate spin speeds (relative to the platter), it revealed a ripple effect (described in the parent application), and it can also be more easily and efficiently implemented in software.

In preferred embodiments, another module of the computer code then uses the described method to calculate the resulting thickness profile for each of a set of available two-level source flux modulation and two-velocity sweep recipes (in which the power applied to the source has a sequence of two levels, and the substrate sweep velocity has a sequence of two values, during each deposition run) or two-level source flux modulation recipes (in which the power applied to the source has a sequence of two levels during each deposition run, and the sweep velocity remains constant). The resulting thickness profiles are then searched, preferably using an animated graphical user interface described herein with reference to FIG. 7 (with each displayed image representing variation of only two free parameters), for a recipe (an optimal or nearly optimal recipe) which is predicted to give the desired coating thickness profile. In this way the inversion problem of how to calculate what $\Theta(t)$ and $\Omega(t)$ are needed to get the desired $T(r)$ is solved by the user searching visually, considering only a subset of the possible $\Theta(t)$ and $\Omega(t)$, varying the source flux recipe at a constant sweep recipe, or varying the sweep recipe at a constant source flux recipe. In this way, an optimal combination of sweep recipe and flux recipe can be found that work together to achieve the desired profile, while accommodating the limitations of the coating equipment, such as how fast velocity and flux can be changed.

In other implementations, the computer code is generalized to calculate $T(r)$ for an arbitrary $E)(t)$, represented by a stepped source flux modulation recipe (a recipe in which the power applied to the source has a sequence of three or more levels during each deposition run). In such case, the thickness calculation is the same as that described above but the results cannot be searched with animated displays of the type shown in FIG. 7 because with more than two power levels in the recipe there are too many free parameters to represent all the possibilities on a flat display.

An alternative use of the same modules of computer code can solve the inversion problem more generally. Leaving $\Theta(t)$ fixed ($\Theta_i \in \{\Theta_1, \Theta_2, \Theta_3, \ldots\}$) the inventive computer code calculates what $T(r)$ would result from keeping the platter fixed at each $\Theta_i$ (i.e., $\Theta_1 \rightarrow T_1(r)$, $\Theta_2 \rightarrow T_2(r), \ldots$, and $\Theta_n \rightarrow T_n(r)$). Then the desired thickness profile $T(r)$ is written as a linear combination of the $T_i(r)$.

$$T(r) = \sum_{i=1}^{n} a_i T_i(r)$$

and the velocity recipe needed to achieve this is then given by inverting the discrete function $t(\Theta)$:

$$\Theta(t) \rightarrow t^{-1}(\Theta),$$

where $t(\Theta)$ is given by the ordered pairs $(\Theta_1, a_1)$ $(\Theta_2, a_2) \ldots (\Theta_n, a_n)$. The $a_i$ represent the lengths of time that should be spent at the $\Theta_i$ in order to give the desired thickness profile. The $a_i$ are thus points defining a discrete function $\Theta(t)$ which is a stepwise velocity modulation recipe to give the desired film thickness profile. A continuous function approximating $\Theta(t)$ would be written in practice to control the platter motion.

This type of more general inversion could be performed for power modulation as well. It would use the same formalism set forth above, except that the coefficients $a_i$, instead of representing the time spent over each point, would be the level of power used at each point. Then, the set of all $a_i$'s would determine a power recipe rather than a velocity recipe.

In this way the code can be used to solve the general inversion problem and write a recipe to achieve any thickness profile accessible with finite velocity recipes. It is contemplated that such embodiments of the inventive method can be performed iteratively (with any number of iterations), for example, as follows. From a desired film thickness profile (and data indicative of the measured flux distribution of a vapor deposition source operated at each of a number of applied power levels), an inversion calculation is performed to determine a first source flux modulation recipe that is predicted to achieve (at least approximately)

the desired film thickness profile. Then, a vapor deposition operation is performed in which the source deposits a film on a test substrate while the test substrate is swept across the source in accordance with the first source flux modulation recipe, and measured thickness data is generated by measuring the thickness as a function of position on the test substrate of the film so deposited. Then, from the measured thickness data, a "corrected" desired film thickness profile (i.e., one expected to compensate for thickness profile errors identified from the measured thickness data, without introducing significant additional error) is determined. Then, from the corrected desired film thickness profile (and the data indicative of measured flux distribution of the source), another inversion calculation is performed to determine a second source flux modulation recipe that is predicted to achieve (at least approximately) the desired film thickness profile. Of course, additional iterations can be performed if necessary. Each such iteration would include a step of depositing a film on a test substrate, a step of measuring the result, a step of determining a "corrected" desired film thickness profile, and a step of performing an inversion calculation to determine a new source flux modulation recipe.

In typical implementations of the invention (in which the source is sufficiently large relative to the spinning substrate so that there is a substrate position relative to the source in which the entire spinning substrate is exposed to and can be coated by the source), the programmed computer predicts the result of implementing each of many source flux modulation recipes, wherein (in each recipe) the platter moves the substrate across the source at a constant sweep velocity, but in three stages, with a sequence of power levels applied to the source (while the substrate spins about its center relative to the platter at a specified spin speed, which can be zero): a first stage in which the source is operated at a first power while the platter moves the substrate relative to the source with only a leading portion of the substrate (including the leading edge but not the substrate's center) exposed to the source; a second stage in which the source is operated at a second power while the platter moves the substrate relative to the source with at least a central portion of the substrate including the substrate's center exposed to the source (e.g., the entire substrate including leading edge, trailing edge, and center, in implementations in which the substrate spin speed is sufficiently large relative to the platter speed); and a third stage in which the source is operated at the first power while the platter moves the substrate relative to the source with only trailing portion of the substrate (including the trailing edge but not the substrate's center) exposed to the source. In a final stage, in which the platter moves the substrate while no portion of the substrate is exposed to the source (e.g., after the trailing edge of substrate 11 has passed over the source and before substrate 11's leading edge again reaches of the source), the power at which the source is operated and the speed of the substrate relative to the source are irrelevant and can have any value (except to the extent that such speed and power are determined by speed and power requirements for a second substrate, where both the substrate and second substrate are moved by the same platter).

FIG. 4 is a diagram of the path (31) of a point on the periphery of disk-shaped substrate 11 of FIG. 3 or FIG. 3A, and the path (30) of substrate 11's center, as the substrate translates across one of the sources of the FIG. 3 (or FIG. 3A) system (while the substrate spins about its center). FIG. 4 shows that the peripheral point's path 31 is very different from the center point's path 30.

Figure 5:
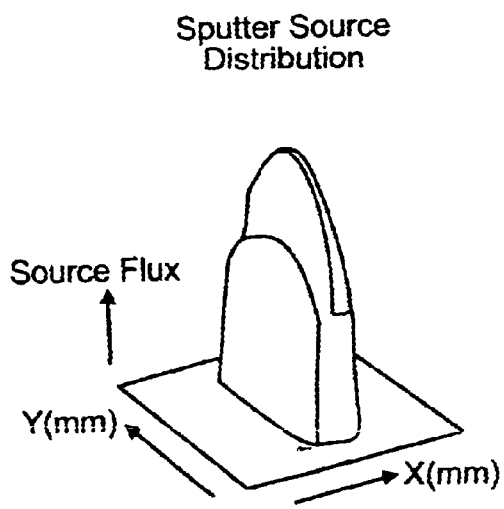
FIG. 5 is a graph of the source flux distribution for one of the sources of the FIG. 3 system.

FIG. 5 is a graph of the source flux distribution for one of the sources of the FIG. 3 system, with the source operated at a fixed level of applied power.

Figure 6:
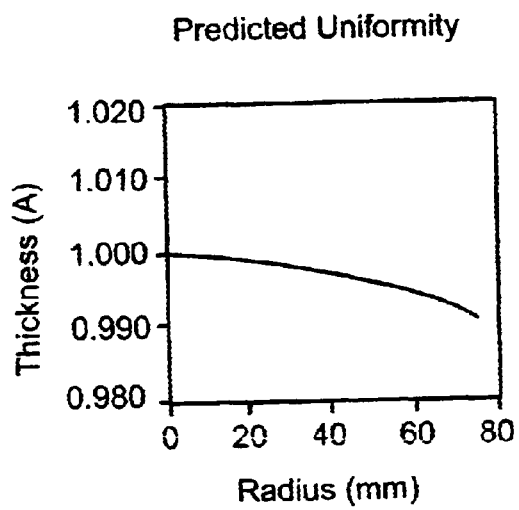
FIG. 6 is a graph of a predicted uniformity of film thickness deposited on substrate 11 by the system of FIG. 3 (using only one of the two sources) assuming constant (relatively low) rotational speed of platter 5 about shaft 6 and constant (relatively high) rotational speed of the substrate about shaft 8 during the vapor deposition, and assuming the nonuniform but constant source flux distribution shown in FIG. 5 for the source employed to deposit the film.

FIG. 6 is a graph of a predicted uniformity of film thickness deposited on substrate 11 by the system of FIG. 3 (using only one of the two sources) assuming constant (relatively low) rotational speed of platter 5 and constant (relatively high) rotational speed of the substrate: about shaft 8 during the vapor deposition, and assuming the nonuniform but constant source flux distribution shown in FIG. 5 for the source employed to deposit the film.

In preferred implementations of the inventive method, the thickness profile is calculated for a large number of different two-level source flux recipes in advance. "Two-level recipe" is used herein to denote a sequence of steps in which a substrate spins about its center while it is moved by the platter relative to the source which satisfy the following criteria: platter 5 is rotated at a first speed with one of the sources operated at a first power level while a leading portion of a substrate passes over the source (but before the substrate's center reaches the source); then, while at least a central portion of the spinning substrate is exposed to the source (typically the entire spinning substrate, for example when the substrate spin speed is sufficiently large relative to the platter speed and/or where the source is sufficiently large relative to the substrate), platter 5 is rotated at the first speed and the source is operated at a second power level (different than the first power level) until the substrate's central portion has passed beyond the source; and then platter 5 rotates at the first speed and the source is operated at the first power level (at least until the substrate's trailing edge, and thus the entire substrate, has passed beyond the source). In a final stage, in which the platter continues to move the substrate while no portion of the substrate is exposed to the source (e.g., after the trailing edge of the substrate has passed over the source and before the substrate's leading edge again reaches the source), the speed of the substrate relative to the source and the power applied to the source are irrelevant and can have any values (except to the extent that the speed and power are determined by requirements for a second substrate, where both the substrate and second substrate are moved by the same platter).

Also in preferred implementations, a user-interface is provided to allow the user to explore (i.e., "surf" through) an array of possible recipes (e.g., source flux modulation recipes): by selecting different ones of the recipes using a computer mouse, in order to view nearly instantly a display of the previously calculated predicted film thickness profile resulting from (and corresponding to) each selected recipe; or by selecting different ones of the predicted film thickness profiles using a computer mouse, in order to view nearly instantly a display identifying the recipe corresponding to each selected predicted film thickness profile. In this way, a computer programmed in accordance with the invention (to generate the predicted thickness profiles) can be used to select easily a power modulation recipe which is adequate to achieve the desired thickness profile (i.e., to select an optimal power recipe).

An important aspect of preferred implementations of the invention is that they characterize each source flux modulation recipe with only two parameters (e.g., each source flux modulation recipe is a two-level recipe characterized by two applied power levels at which the source is operated during a sweep of the substrate across the source). This simple profile characterization allows use of the preferred graphical user interface (described with reference to FIGS. 7 and 8). Use of the preferred user interface in turn provides the user with insight into what could be done with two-level recipes that is invaluable in making good decisions on the use of limited coating time. For example, it will be apparent to the user from the user interface which recipe can achieve a desired combination of coating characteristics (e.g., uniformity across the sample) and efficient coating (e.g., coating with sufficiently high source flux to avoid excessive time for coating, and coating with sufficient substrate spin speed to achieve desired coating low-ripple characteristics).

Figure 7:
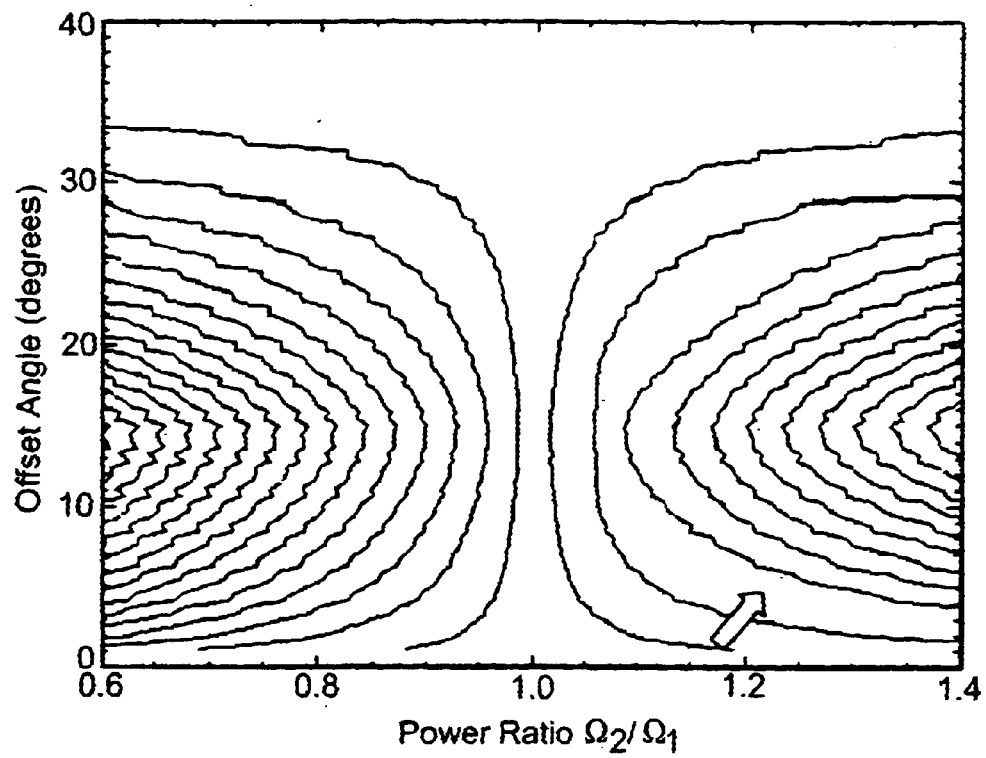
FIG. 7 is a screen display generated by a computer system programmed in accordance with a preferred embodiment of the invention, showing a contour plot of predicted deposited film thickness uniformity (peak to valley thickness difference) for the FIG. 3 system operated (with each of a set of two-power-level recipes) to coat a flat substrate. $\Omega_2$ is the power at which the source operates while only the leading or trailing portion (not the center) of the substrate is exposed to the source, $\Omega_1$ is the power at which the source operates while the central portion of the substrate (the entire substrate including its center, if the substrate is spinning) is exposed to the source, and the "offset angle" is the angular position of the platter when the power is changed from $\Omega_2$ to $\Omega_1$. This plot is used to search for those recipes which yield the smallest deviation from the desired thickness profile.
Figure 8:
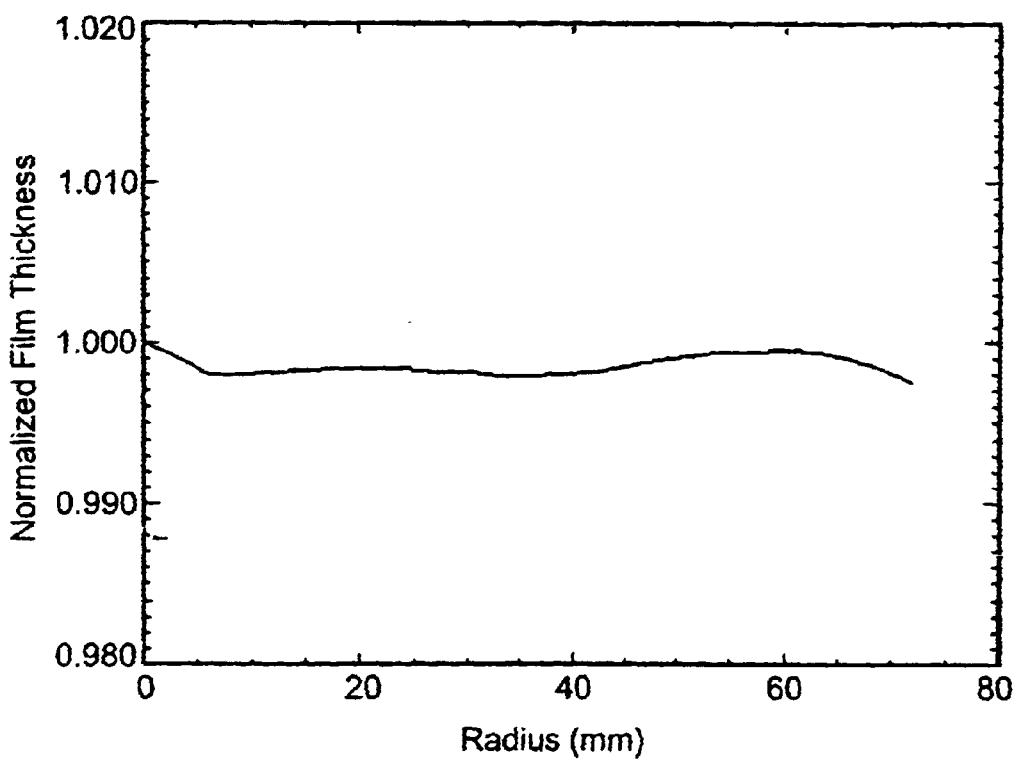
FIG. 8 is a screen display generated (by the computer system which generates FIG. 7) by clicking on the point (on the FIG. 7 display) indicated by the arrow-shaped cursor. The display of FIG. 8 is a graph of predicted film thickness as a function of radial position on the sample, for the FIG. 3 system operated with the two-power recipe having the $\Omega_1$, $\Omega_2$, and offset angle parameters of the point (on the FIG. 7 display) indicated by the arrow cursor. The high uniformity of this plot shows that this is a nearly optimal recipe.
Figure 9:
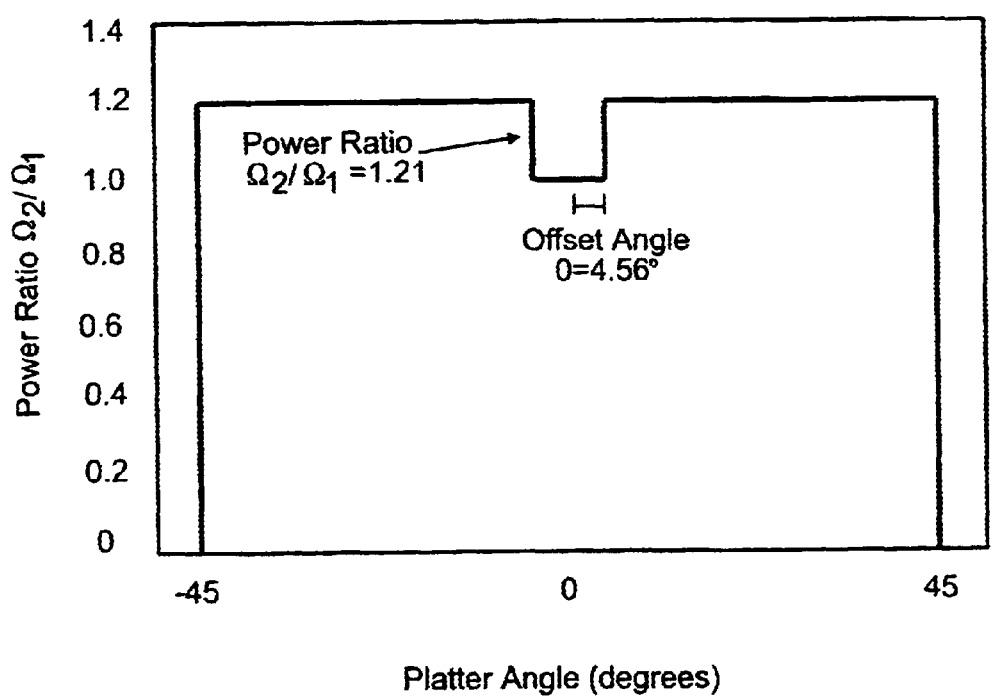
FIG. 9 is a graph representing the two-power-level used to produce the coatings mentioned with reference to FIGS. 7 and 8. The power is decreased while the substrate is directly over the source to thin the coating at the center relative to the edges. This recipe is denoted by the arrow on FIG. 7 and yields the uniformity of FIG. 8.

FIG. 7 is a contour plot of the predicted deposited film thickness uniformity (ratio of peak thickness to valley thickness) generated using the system of FIG. 3 to coat a flat substrate with each of a set of two-power source recipes, wherein $\Omega_2$ is the source power while only the leading or trailing portion (not the center) of the substrate is exposed to the source, $\Omega_1$ is the source power while the central portion of the substrate (the entire substrate including its center, if the substrate is spinning) is exposed to the source, and the "offset angle" is the platter angle position at which the power undergoes the transition from $\Omega_2$ to $\Omega_1$. FIG. 7 assumes that the substrate is a flat disk having 6 inch diameter, the source has rectangular shape and size 4.3 inch×10.7 inch (so that the relative size of the source and substrate are approximately as shown in FIG. 4), the center of the substrate is 8.75 inches from the center of the platter, and the substrate spins about its center (relative to the platter) at about 320 rpm (revolutions per minute). FIG. 8 is the radial film thickness profile for the nearly optimal platter recipe (selected from the set of two-power recipes employed to generate FIG. 7 with the criterion that it is a recipe predicted to cause an acceptably low difference of peak thickness and valley thickness during a sweep of the spinning substrate across the source) in which $\Omega_2/\Omega_1=1.21$), and the offset angle is 4.56 degrees. With this value of the offset angle, the offset angle is the angle traversed by the substrate/platter, as it is swept across the source, from the start of the recipe until the time that the center of the substrate is still approximately 4.5 degrees from being centered over the source). At that position, the source power undergoes a transition from $\Omega_2$ to $\Omega_1$, and continues at $\Omega_1$ until the center of the substrate has reached a position about 4.5 degrees beyond the source (at which time the source power undergoes another transition from $\Omega_1$ to $\Omega_2$).

The computational approach of the invention (for radial film thickness profile prediction) allows simulation of a finite spin velocity of the substrate, predicting a "ripple effect" which has been confirmed experimentally. It also provides a way to predict the sensitivity of the coating process to inaccuracies in substrate position, velocity, etc., which would be tedious to find experimentally and so provides critical guidance on how to improve the deposition system as well as achieve optimized operation.

It is straightforward to implement the invention with software that assumes source flux modulation recipes with more than two source power levels.

In preferred implementations to be described with reference to FIGS. 7 and 8, a computer programmed in accordance with the invention has a user interface which displays predicted peak-to-valley coating thickness error for each of a number power modulation recipes (preferably in the form of a contour map such as that shown in FIG. 7), and also displays a cursor (e.g., the arrow-shaped cursor of FIG. 7). By manipulating an input device (e.g., mouse 20B of FIG. 3) the user can select any of a number of points on the thickness error display. In response to each selected point, the computer displays a graph (e.g., that of FIG. 8) of predicted coating thickness as a function of position on the substrate (for the corresponding power modulation recipe). The graph of FIG. 8 indicates predicted coating thickness as a function of radial position on a radially symmetric substrate, for the power modulation recipe corresponding to the position of the cursor in FIG. 7 (i.e., the power modulation recipe characterized by $\Omega_2/\Omega_1=1.21$, offset angle= 4.56 degrees, and a constant platter velocity). This source flux and sweep velocity function is approximately the nearly optimal sweep velocity function mentioned above with reference to FIG. 8, in which $\Omega_2/\Omega_1=1.21$ and offset angle= 4.56 degrees. By inspecting the graph for each of several points on the thickness error display (e.g., that of FIG. 7), the user can conveniently determine an optimal source flux and substrate sweep velocity function (for achieving a predetermined coating thickness profile on the substrate).

In FIG. 7, each contour line represents power recipe functions predicted to cause a single unique thickness uniformity error (the difference between maximum (peak) coating thickness and minimum (valley) coating thickness). The "lowest" points on the FIG. 7 contour map (those enclosed by the "lowest" contours) represent the most uniform coatings (and the source flux and sweep velocity functions which are predicted to produce such coatings).

It is contemplated that displays will be used similar to that of FIG. 7 except in that the two axes represent the following free parameters of a two-level source flux and substrate sweep velocity modulation recipe: offset angle (the angle traversed by the substrate (as it is swept by the platter at a constant angular velocity around the platter's axis and across the source) from the start of the recipe until the time that the power applied to the source undergoes a transition from a first level to a second level); and ratio of the two power levels applied to the source (during a substrate sweep at constant velocity across the source).

In one implementation, the user clicks and holds a mouse button (with the cursor positioned at a desired point on the FIG. 7 display). In response, the computer displays a graph (such as that of FIG. 8) which indicates predicted coating thickness as a function of radial position on the substrate (which is assumed to be a radially symmetric substrate), for the source flux and sweep velocity modulation function corresponding to the position of the cursor. The appearance of the FIG. 8 graph changes dynamically as the cursor is moved across the FIG. 7 contour map (e.g., refreshing at 2 or 3 Hertz using a 233 MHz Pentium-powered personal computer).

The inventors contemplate that a user interface of the type described with reference to FIGS. 7 and 8 can be implemented on a personal computer (with a 233 MHz Pentium processor) in the IDL data processing environment. IDL ("Interactive Data Language") software is available from Research Systems, Inc. (of Boulder, Colo.), and is a language designed for data visualization and application development. This implementation of the invention would use straightforward numerical implementations of the above-described analytical expressions that are employed in the above-described preferred implementation of calculation (in accordance with the invention) of the coating thickness profile on a substrate to be coated. Implementing a user interface (of the type described with reference to FIGS. 7 and 8) in the IDL data processing environment allows the programmer to incorporate standard IDL routines for rapid interpolation, integration and animated graphing.

In the IDL data processing environment, the quantities used in the calculations, such as the velocity recipe contained in $\Theta(t)$, were represented as large arrays, because the IDL language has highly efficient routines for processing large arrays of data in parallel. The IDL language also provides for easy production of an animated display of data (such as in the graphical user interface described with reference to FIGS. 7 and 8), and for the dynamical choice of points from one window to be represented as a curve in another using the mouse. Provision of such a graphical user interface makes searching the available recipe space simple and provides a much better understanding of what thickness profiles are possible with two-velocity sweep recipes (or two-level source flux modulation recipes) than could have been obtained by isolated calculations.

In alternative embodiments, the computed error values (employed to generate a contour map such as that of FIG. 7) are determined by application of a merit function which is indicative of the amount (or degree) of error between the predicted film thickness profile for each of the source flux and sweep velocity modulation recipes (or source flux modulation recipes) and the desired film thickness profile. Examples of such merit functions include (but are not limited to) the following: RMS (root mean squared) error, standard deviation error, RMS error after subtraction of a function (e.g., a quadratic function) from the predicted film thickness profile for each recipe, and peak-to-valley error. Each point on the resulting contour map has a magnitude and a position, each magnitude being indicative of the error value determined by application of the merit function to one of the predicted film thickness profiles, and each position being indicative of parameters which characterize a different one of the recipes.

The inventors have recognized that slow (or zero) substrate spin speed (relative to the platter) while the platter sweeps the substrate across the source gives rise to a ripple effect (in which coating thickness varies as a function of radius across a radially symmetric substrate). For some applications, a slow or zero substrate spin speed can give a specially graded film thickness with azimuthal as well as radial thickness variation. The shape of such a variation could be predicted with the inventive software by simply varying the parameter for the substrate spin speed (which typically has a standard or default value of about 320 rpm).

The present invention is not limited to determine source flux sweep and velocity modulation recipes (or source flux modulation recipes) for achieving uniform thickness coatings (on flat or curved substrates). It can also be used to determine source flux and sweep velocity modulation recipes (or source flux modulation recipes) for achieving coatings in which the coating thickness is graded (or otherwise varies) across a flat or curved substrate. Optical coatings commonly have such prescriptions in order to compensate for variations in the incident angle of light across the optic. The invention thus eliminates the need for use of a precisely constructed shadow mask (e.g., made of aluminum milled to block portions of the source, shaping it to deliver the desired thickness profile on the substrate) over each substrate to achieve a desired non-uniform coating on the substrate.

In other embodiments, the invention is a method of processing data indicative of the flux distribution of a vapor deposition source (operated at each of a number of applied power levels), and data indicative of "offset angles" traversed by the substrate as it is swept by a rotating platter around the platter's axis of rotation and across the source (each offset angle being the angle traversed by the substrate relative to the source from the start of the recipe until the time that some parameter of a source flux modulation recipe (or source flux and sweep velocity modulation recipe) undergoes a transition from one value to another value, to determine a predicted film thickness profile for each of a set of three-level source flux modulation recipes (or three-level source flux and sweep velocity modulation recipes). Each recipe specifies that the substrate sweeps across the source while a sequence of three power levels is applied to the source, and is characterized by four free parameters: the ratio between a first power level and a second power level, the ratio between the second power level and a third power level, a first offset angle (specifying the transition from the first to the second power level), and a second offset angle (specifying the transition from the second to the third power level).

In some embodiments, the inventive method is used to determine the parameters needed for depositing a custom film, having a very precise thickness profile, on a curved optic. Such custom film can be an underlayer which underlies a multilayer coating, and which can alter the figure of the optic by hundreds of nanometers (or more). If a precision surface is produced and polished, and then found to have the wrong figure, the invention could be performed to determine how to correct the figure. We contemplate that such embodiments of the invention would typically be applied to correct overall shape; not to correct scratches and other localized errors (although it could be applied to correct localized errors).

Different embodiments of the invention assume different geometries for the apparatus employed to effect relative motion of the vapor deposition source and substrate, such that the substrate is exposed to the source to be coated by vapor deposition. Some embodiments (including the preferred embodiments described above) assume rotational motion of the substrate relative to one or more fixed sources. Others assume rotational motion of one or more sources relative to a fixed substrate. Other embodiments assume linear (or other non-rotational) motion of a substrate relative to a fixed source (or of a source relative to a fixed substrate). In the claims, the expression that a substrate "sweeps" (or is swept) across (or relative to) a source is intended to cover all such cases (including cases in which the substrate is fixed in some frame of reference and the source moves relative to the substrate in such frame of reference). Of course, in embodiments in which the substrate is fixed and the source moves, the expression "sweep velocity modulation recipe" denotes the sweep velocity of the source relative to the substrate as a function of time during a time interval in which the source sweeps across the substrate.

One class of preferred embodiments of the invention assumes that the substrate undergoes rotational motion relative to a fixed source by being swept by a rotating platter relative to the source, while the substrate spins about its own central axis (or center of mass). In other embodiments, the substrate spins about a fixed axis while the source moves (rotationally, linearly, or otherwise) relative to the substrate. In other embodiments, the substrate undergoes linear or other non-rotational motion relative to a fixed source, while the substrate spins about its own central axis (or center of mass).

In the preferred embodiments described with reference to FIGS. 3 and 3A, the substrate sequentially sweeps across two fixed sources during each full platter rotation. In other embodiments of the invention, the substrate sequentially sweeps across three or more fixed sources during each full platter rotation (or the substrate otherwise periodically sweeps across three or more sources), so that multi-layer coatings can be conveniently deposited on the substrate.

It is contemplated that the inventive method can be performed iteratively (with any number of iterations) to determine, from a set of predicted film thickness profiles and measured thickness data, a source flux modulation recipe (or source flux and sweep velocity modulation recipe) that is adequate to achieve a desired thickness profile. For example, after measuring the flux distribution of a vapor deposition source at each of several applied power levels (e.g., by holding a patterned wafer stationary relative to the source while performing a vapor deposition operation in which the source (operated at one of the applied power levels) deposits a test film of material on the wafer, and then measuring the thickness of the test film as a function of position on the wafer) and calculating a set of predicted film thickness profiles (each of the film thickness profiles assuming that the substrate is swept across a source having the measured flux distribution in accordance with a different one of a set of source flux modulation recipes), one embodiment of the invention includes the following additional steps:

(1) determining from the predicted film thickness profiles a first one of the source flux modulation recipes which is predicted to achieve a thickness profile at least approximately matching the desired thickness profile (e.g., by selecting a point on a contour map display of the type shown in FIG. 7);

(2) performing a vapor deposition operation in which the source deposits a film on a test substrate while the test substrate is swept across the source in accordance with the first one of the source flux modulation recipes;

(3) generating measured thickness data by measuring the thickness (as a function of position on the test substrate) of the film deposited in step (2); and (4) determining, from the predicted film thickness profiles and the measured thickness data, a second one of the source flux modulation recipes which is adequate (or predicted to be adequate) to achieve the desired thickness profile. Step (4) can be accomplished by identifying errors in the thickness profile produced on the test substrate during step (2), and selecting a different point on the contour map display employed in step (1) such that the source flux modulation recipe corresponding to such different point is expected to compensate for the identified thickness profile errors (without introducing significant additional error) and thus achieve the desired thickness profile.

Of course, an additional iteration can be accomplished by performing the following additional steps:

(5) after step (4), performing another vapor deposition operation in which the source deposits a film on a second test substrate while the second test substrate is swept across the source in accordance with the second one of the source flux modulation recipes;

(6) generating additional measured thickness data by measuring the thickness (as a function of position on the second test substrate) of the film deposited in step (5); and (7) determining, from the predicted film thickness profiles and the additional measured thickness data, a third one of the source flux modulation recipes which is adequate (or predicted to be adequate) to achieve the desired thickness profile. Step (7) can be accomplished by identifying errors in the thickness profile produced on the second test substrate during step (5), and selecting a third point on the contour map display employed in step (1), such that the source flux modulation recipe corresponding to such third point is expected to compensate for the identified thickness profile errors (without introducing significant additional error) and thus achieve the desired thickness profile. Additional (third and subsequent) iterations can be performed in the same way.

The foregoing is merely illustrative and explanatory of preferred embodiments of the inventive methods and apparatus. Various changes in the details of the embodiments described herein may be within the scope of the appended claims. The invention pertains to methods and systems for vapor deposition such as methods and systems for sputtering (including DC magnetron sputtering as well as other types of sputtering), CVD, and electron beam evaporation, including the steps of measuring or estimating the source flux distribution (using a test piece that is held stationary in a position in which it is exposed to a source operated at each of a number of applied power levels), calculating the predicted thickness profile of the film under any of a variety of source flux modulation recipes (assuming the measured source flux distributions), and then determining an optimal (or nearly optimal) source flux modulation recipe to achieve a desired thickness profile (or elements configured to perform such steps).

What is claimed is:

1. A method for determining a source flux and sweep velocity modulation recipe for achieving a selected thickness profile of a film to be deposited on a substrate by sweeping said substrate across a vapor deposition source with a sweep velocity as a function of time determined by, and operating the source in accordance with, said source flux and sweep velocity modulation recipe, wherein the source has a different flux distribution when operated at each of a number of different applied power levels, said method including the steps of:

(a) measuring the flux distribution of the source at each of the power levels by holding a patterned wafer stationary relative to the source while performing a vapor deposition operation in which the source is operated at said each of the power levels to deposit a test film of material on the wafer, and measuring the thickness of each said test film as a function of position on the wafer, thereby generating data determining each said flux distribution;

(b) calculating a set of predicted film thickness profiles, each of the film thickness profiles assuming that the substrate is swept across the source and the source is operated in accordance with a different one of a set of source flux and sweep velocity modulation recipes; and (c) determining from the predicted film thickness profiles one of the source flux and sweep velocity modulation recipes which is adequate to achieve the selected thickness profile.

2. The method of claim 1, wherein each of the source flux and sweep velocity modulation recipes is a source flux modulation recipe that specifies source flux distribution as a function of time during a time interval in which the substrate sweeps across the source with constant velocity.

3. The method of claim 1, wherein each of the source flux and sweep velocity modulation recipes specifies source flux distribution as a function of time, and substrate velocity relative to the source as a function of time, during a time interval in which the substrate sweeps across the source.

4. The method of claim 1, wherein each said patterned wafer includes a layer of photoresist material with a pattern of features in the layer of photoresist material, and wherein step (a) includes the steps of:

after the test film has been deposited on the patterned wafer, performing a lift-off operation to remove from said patterned wafer the photoresist material together with the vapor deposited material on the photoresist, so that the vapor deposited material in the features remains as an array of elevated features on the wafer, each of the elevated features having a thickness, and measuring the thickness of each of the elevated features using a mechanical profilometer to generate flux distribution data indicative of feature thickness as a function of position on the wafer, such that said flux distribution data determines the flux distribution.

5. The method of claim 1, wherein step (c) includes the steps of:
  (d) determining from the predicted film thickness profiles a first one of the source flux and sweep velocity modulation recipes which is predicted to achieve a thickness profile at least approximately matching the selected thickness profile;
  (e) performing a vapor deposition operation in which the source deposits a film of the material on a test substrate while the test substrate is swept across the source and the source is operated in accordance with the first one of the source flux and sweep velocity modulation recipes;
  (f) generating measured thickness data by measuring thickness as a function of position on the test substrate of the film deposited in step (e); and
  (g) determining, from the predicted film thickness profiles and the measured thickness data, said one of the source flux and sweep velocity modulation recipes which is adequate to achieve the selected thickness profile.

6. The method of claim 1, wherein step (c) includes the steps of:
  (d) determining from the predicted film thickness profiles a first one of the source flux and sweep velocity modulation recipes which is predicted to achieve a thickness profile at least approximately matching the selected thickness profile;
  (e) performing a vapor deposition operation in which the source deposits a film of the material on a test substrate while the test substrate is swept across the source and the source is operated in accordance with the first one of the source flux and sweep velocity modulation recipes;
  (f) generating measured thickness data by measuring thickness as a function of position on the test substrate of the film deposited in step (e);
  (g) determining, from the predicted film thickness profiles and the measured thickness data, a second one of the source flux and sweep velocity modulation recipes which is predicted to achieve another thickness profile at least approximately matching the selected thickness profile;
  (h) performing another vapor deposition operation in which the source deposits a film of the material on a second test substrate while the second test substrate is swept across the source and the source is operated in accordance with the second one of the source flux and sweep velocity modulation recipes;
  (i) generating additional measured thickness data by measuring thickness as a function of position on the second test substrate of the film deposited in step (h); and
  (j) determining, from the predicted film thickness profiles and the additional measured thickness data, said one of the source flux and sweep velocity modulation recipes which is adequate to achieve the selected thickness profile.

7. The method of claim 1, wherein step (c) includes the steps of:
  (d) determining from the predicted film thickness profiles one of the source flux and sweep velocity modulation recipes which is predicted to achieve a thickness profile at least approximately matching the selected thickness profile;
  (e) performing a vapor deposition operation in which the source deposits a film of the material on a test substrate while the test substrate is swept across the source and the source is operated in accordance with said one of the source flux and sweep velocity modulation recipes;
  (f) generating measured thickness data by measuring thickness as a function of position on the test substrate of the film deposited in step (e);
  (g) determining, from the predicted film thickness profiles and the measured thickness data, a different one of the source flux and sweep velocity modulation recipes which is predicted to achieve another thickness profile at least approximately matching the selected thickness profile;
  (h) performing at least one iteration of steps (e), (f) and (g), wherein during each performance of step (e), a different test substrate is swept across the source and the source is operated in accordance with the one of the source flux and sweep velocity modulation recipes determined in the most recent performance of step (g), and wherein the final performance of step (g) determines said one of the source flux and sweep velocity modulation recipes which is adequate to achieve the selected thickness profile.

8. A method for determining a source flux and sweep velocity modulation recipe for achieving a selected thickness profile of a film to be deposited on a substrate by sweeping said substrate across a vapor deposition source with a sweep velocity as a function of time determined by, and operating the source in accordance with, said source flux and sweep velocity modulation recipe, wherein the source has a different flux distribution when operated at each of a number of different applied power levels, said method including the steps of:
  (a) measuring the flux distribution of the source at each of the applied power levels, thereby generating flux distribution data;
  (b) processing source flux and sweep velocity modulation recipe data with the flux distribution data to generate a set of predicted thickness profiles of films deposited by the source on a substrate, wherein the source flux and sweep velocity modulation recipe data determines a set of predetermined source flux and sweep velocity modulation recipes, each of the predicted thickness profiles assumes and corresponds to a different one of the source flux and sweep velocity modulation recipes, and each of the source flux and sweep velocity modulation recipes determines source flux distribution as a function of time during a sweep of the substrate across the source; and
  (c) determining from the predicted thickness profiles said source flux and sweep velocity modulation recipe for achieving the selected thickness profile.

9. The method of claim 8, wherein each of the predetermined source flux and sweep velocity modulation recipes is a source flux modulation recipe that specifies said source flux distribution as a function of time during a time interval in which the substrate sweeps across the source with constant velocity.

10. The method of claim 8, wherein each of the predetermined source flux and sweep velocity modulation recipes specifies source flux distribution as a function of time, and substrate velocity relative to the source as a function of time, during a time interval in which the substrate sweeps across the source.

11. The method of claim 8, wherein step (b) includes the steps of:

for each of the source flux and sweep velocity modulation recipes, determining the time that each point of a set of points on the substrate spends over each of a set of points of the source during the sweep;

generating a set of product values by multiplying each such time by a rate of film deposition at the corresponding point of the source determined from the flux distribution data; and summing the product values to generate, for said each of the source flux and sweep velocity modulation recipes, a set of predicted thickness values comprising a predicted thickness value for each point of the set of points of the substrate.

12. The method of claim 11, wherein step (c) includes the step of:

generating error values from the predicted thickness values, each of the error values being indicative of an amount of film thickness nonuniformity associated with a different one of the source flux and sweep velocity modulation recipes.

13. The method of claim 12, wherein step (c) also includes the step of:

processing the error values to generate and display a contour map, each contour line of the contour map being indicative of those of the source flux and sweep velocity modulation recipes that are predicted to cause a particular amount of film thickness nonuniformity.

14. The method of claim 11, wherein step (c) includes the step of:

generating error values from the predicted thickness values, each of the error values being indicative of an amount of film thickness error associated with a different one of the source flux and sweep velocity modulation recipes.

15. The method of claim 14, wherein step (c) also includes the step of:

processing the error values to generate and display a contour map, each contour line of the contour map being indicative of those of the source flux and sweep velocity modulation recipes that are predicted to cause a particular amount of film thickness error.

16. The method of claim 15, wherein each of the error values is determined by application of a merit function to a different one of the predicted thickness profiles, each point on the contour map has a magnitude and a position, each said magnitude is indicative of one of the error values, and each said position is indicative of parameters characterizing a different one of the source flux and sweep velocity modulation recipes.

17. The method of claim 15, wherein each of the error values is indicative of a peak thickness to valley thickness difference resulting from a different one of the source flux and sweep velocity modulation recipes, each point on the contour map has a magnitude and a position, each said magnitude is indicative of peak to valley thickness difference error, and each said position is indicative of parameters characterizing a different one of the source flux and sweep velocity modulation recipes.

18. The method of claim 14, wherein step (c) also includes the steps of:

producing a user interface which includes a displayed contour map, including by processing the error values to generate the contour map, wherein each contour line of the contour map is indicative of those of the source flux and sweep velocity modulation recipes that are predicted to cause a particular amount of film thickness error; and in response to selecting a point on the displayed contour map, graphically displaying one of the predicted thickness profiles that corresponds to said point on the contour map.

19. The method of claim 18, wherein each of the error values is indicative of a peak thickness to valley thickness difference resulting from a different one of the source flux and sweep velocity modulation recipes, each point on the displayed contour map has a magnitude and a position, each said magnitude is indicative of peak to valley thickness difference error, and each said position is indicative of parameters characterizing a different one of the source flux and sweep velocity modulation recipes.

20. The method of claim 18, wherein each of the error values is determined by application of a merit function to a different one of the predicted thickness profiles, each point on the displayed contour map has a magnitude and a position, each said magnitude is indicative of one of the error values, and each said position is indicative of parameters characterizing a different one of the source flux and sweep velocity modulation recipes.

21. The method of claim 8, wherein the vapor deposition source is a magnetron sputtering deposition source, and the set of predicted thickness profiles generated in step (b) is a set of predicted thickness profiles of films deposited by the magnetron sputtering deposition source on the substrate.

22. The method of claim 8, wherein the substrate is a flat substrate and the set of predicted thickness profiles generated in step (b) is a set of predicted thickness profiles of films deposited by the source on the flat substrate.

23. The method of claim 8, wherein the substrate is an optic having nonzero curvature, and the set of predicted thickness profiles generated in step (b) is a set of predicted thickness profiles of films deposited by the source on the optic having nonzero curvature.

24. The method of claim 8, wherein the substrate is an optic having a figure to be corrected by deposition of the film on said optic, the set of predicted thickness profiles generated in step (b) is a set of predicted thickness profiles of films deposited by the source on the optic, and the selected thickness profile of the film is such that deposition of the film onto the optic achieves a desired correction of said figure of the optic.

25. The method of claim 8, wherein step (c) includes the steps of:

(d) determining from the predicted thickness profiles a first one of the source flux and sweep velocity modulation recipes which is predicted to achieve a thickness profile at least approximately matching the selected thickness profile;

(e) performing a vapor deposition operation in which the source deposits a film of the material on a test substrate while the test substrate is swept across the source and the source is operated in accordance with the first one of the source flux and sweep velocity modulation recipes;

(f) generating measured thickness data by measuring thickness as a function of position on the test substrate of the film deposited in step (e); and (g) determining, from the predicted film thickness profiles and the measured thickness data, said source flux and sweep velocity modulation recipe for achieving the selected thickness profile.

26. The method of claim 8, wherein step (c) includes the steps of:

(d) determining from the predicted thickness profiles one of the source flux and sweep velocity modulation recipes which is predicted to achieve a thickness profile at least approximately matching the selected thickness profile;

(e) performing a vapor deposition operation in which the source deposits a film of the material on a test substrate while the test substrate is swept across the source and the source is operated in accordance with said one of the source flux and sweep velocity modulation recipes;

(f) generating measured thickness data by measuring thickness as a function of position on the test substrate of the film deposited in step (e);

(g) determining, from the predicted thickness profiles and the measured thickness data, a different one of the source flux and sweep velocity modulation recipes which is predicted to achieve another thickness profile at least approximately matching the selected thickness profile;

(h) performing at least one iteration of steps (e), (f) and (g), wherein during each performance of step (e), a different test substrate is swept across the source and the source is operated in accordance with the one of the source flux and sweep velocity modulation recipes determined in the most recent performance of step (g), and wherein the final performance of step (g) determines said source flux and sweep velocity modulation recipes for achieving the selected thickness profile.

27. A programmed computer for use with a vapor deposition apparatus including a vapor deposition source operable at each of a number of applied power levels and having a known flux distribution at each of the applied power levels, a substrate, a rotatable platter to which the substrate is mounted, a platter drive assembly coupled to the platter and configured to rotate the platter to sweep the substrate across the source, wherein the programmed computer includes a display device, and wherein the programmed computer is programmed with:

software for determining a source flux and sweep velocity modulation recipe for achieving a selected thickness profile of a film deposited on the substrate as a result of sweeping said substrate across the source with a sweep velocity determined by said source flux and sweep velocity modulation recipe while the source is operated in accordance with said source flux and sweep velocity modulation recipe, wherein said software includes:

software for processing source flux and sweep velocity modulation recipe data with data determining each said flux distribution to generate a set of predicted thickness profiles of films deposited by the source on a substrate, wherein the source flux and sweep velocity modulation recipe data determines a set of predetermined source flux and sweep velocity modulation recipes, each of the predicted thickness profiles assumes and corresponds to a different one of the source flux and sweep velocity modulation recipes; and software for determining from the predicted thickness profiles said source flux and sweep velocity modulation recipe for achieving the selected thickness profile.

28. The programmed computer of claim 27, wherein each of the source flux and sweep velocity modulation recipes is a source flux modulation recipe that specifies source flux distribution as a function of time during a time interval in which the substrate sweeps across the source with constant velocity.

29. The programmed computer of claim 27, wherein each of the source flux and sweep velocity modulation recipes specifies source flux distribution as a function of time, and substrate sweep velocity as a function of time, during a time interval in which the substrate sweeps across the source.

30. The programmed computer of claim 27, wherein the software for processing the source flux and sweep velocity modulation recipe data with the data determining each said flux distribution to generate said predicted thickness profiles includes:

software for determining, for each of the source flux and sweep velocity modulation recipes, the time that each point of a set of points on the substrate spends over each of a set of points of the source during the sweep;

software for generating a set of product values by multiplying each such time by a rate of film deposition at the corresponding point of the source determined from the data determining each said flux distribution; and software for summing the product values to generate, for said each of the source flux and sweep velocity modulation recipes, a set of predicted thickness values comprising a predicted thickness value for each point of the set of points of the substrate.

31. The programmed computer of claim 30, wherein the software for determining from the predicted thickness profiles said source flux and sweep velocity modulation recipe includes:

software for generating error values from the predicted thickness values, each of the error values being indicative of an amount of film thickness nonuniformity associated with a different one of the source flux and sweep velocity modulation recipes; and software for processing the error values to generate a contour map which is displayed on the display device, each contour line of the contour map being indicative of those of the source flux and sweep velocity modulation recipes that are predicted to cause a particular amount of film thickness error.

32. The programmed computer of claim 30, wherein the software for determining from the predicted thickness profiles said source flux and sweep velocity modulation recipe includes:

software for generating error values from the predicted thickness values, each of the error values being indicative of an amount of film thickness error associated with a different one of the source flux and sweep velocity modulation recipes; and software for processing the error values to generate a contour map which is displayed on the display device, each contour line of the contour map being indicative of those of the source flux and sweep velocity modulation recipes that are predicted to cause a particular amount of film thickness error.

33. A computer implemented method, including the steps of:

(a) processing measured flux distribution data, indicative of a flux distribution of a vapor deposition source operated at each of a number of applied power levels, to generate profiles of predicted vapor deposited film thickness on a substrate that would result from sweeping the substrate across the source while operating the source in accordance with each of a set of predetermined source flux and sweep velocity modulation recipes, including by calculating the trajectory of each of a set of points on the substrate over the source during each sweep, and integrating the flux received at each of the set of points on the substrate to obtain a predicted film thickness at said each of the set of points on the substrate during said each sweep; and (b) determining from the profiles of predicted vapor deposited film thickness a source flux and sweep velocity modulation recipe for achieving a selected vapor deposited thickness profile on the substrate.

34. The method of claim 33, wherein each of the source flux and sweep velocity modulation recipes is a source flux modulation recipe that specifies source flux distribution as a function of time during a time interval in which the substrate sweeps across the source with constant velocity.

35. The method of claim 33, wherein each of the source flux and sweep velocity modulation recipes specifies source flux distribution as a function of time, and substrate sweep velocity as a function of time, during a time interval in which the substrate sweeps across the source.

36. The method of claim 33, wherein step (b) includes the steps of:

(c) determining from the profiles of predicted vapor deposited film thickness a first one of the source flux and sweep velocity modulation recipes which is predicted to achieve a thickness profile at least approximately matching the selected vapor deposited thickness profile;

(d) performing a vapor deposition operation in which the source deposits a film of the material on a test substrate while the test substrate is swept across the source and the source is operated in accordance with the first one of the source flux and sweep velocity modulation recipes;

(e) generating measured thickness data by measuring thickness as a function of position on the test substrate of the film deposited in step (d); and (f) determining, from the profiles of predicted vapor deposited film thickness and the measured thickness data, said source flux and sweep velocity modulation recipe for achieving the selected vapor deposited thickness profile on the substrate.

37. The method of claim 33, wherein step (b) includes the steps of:

(c) determining from the profiles of predicted vapor deposited film thickness a first one of the source flux and sweep velocity modulation recipes which is predicted to achieve a thickness profile at least approximately matching the selected vapor deposited thickness profile;

(d) performing a vapor deposition operation in which the source deposits a film of the material on a test substrate while the test substrate is swept across the source and the source is operated in accordance with the first one of the source flux and sweep velocity modulation recipes;

(e) generating measured thickness data by measuring thickness as a function of position on the test substrate of the film deposited in step (d);

(f) determining, from the profiles of predicted vapor deposited film thickness and the measured thickness data, a second one of the source flux and sweep velocity modulation recipes which is predicted to achieve another vapor deposited thickness profile at least approximately matching the selected vapor deposited thickness profile;

(g) performing another vapor deposition operation in which the source deposits a film of the material on a second test substrate while the second test substrate is swept across the source and the source is operated in accordance with the second one of the source flux and sweep velocity modulation recipes;

(h) generating additional measured thickness data by measuring thickness, as a function of position on the second test substrate, of the film deposited in step (g); and (i) determining, from the profiles of predicted vapor deposited film thickness and the additional measured thickness data, said source flux and sweep velocity modulation recipe for achieving the selected vapor deposited thickness profile on the substrate.

38. A method for determining a source flux and sweep velocity modulation recipe for achieving a selected thickness profile of a film to be deposited on a substrate by sweeping said substrate across a vapor deposition source with a sweep velocity as a function of time determined by, and operating the source in accordance with, said source flux and sweep velocity modulation recipe, wherein the source has a different flux distribution when operated at each of a number of different applied power levels, said method including the steps of:

(a) calculating a set of predicted film thickness profiles, each of the film thickness profiles assuming that the substrate is swept across the source while said source is operated in accordance with a different one of a set of source flux and sweep velocity modulation recipes; and (b) determining from the predicted film thickness profiles one of the source flux and sweep velocity modulation recipes which is adequate to achieve the selected thickness profile.

39. The method of claim 38, wherein each of the source flux and sweep velocity modulation recipes is a source flux modulation recipe that specifies source flux distribution as a function of time during a time interval in which the substrate sweeps across the source with constant velocity.

40. The method of claim 38, wherein each of the source flux and sweep velocity modulation recipes specifies source flux distribution as a function of time, and substrate sweep velocity as a function of time, during a time interval in which the substrate sweeps across the source.

41. The method of claim 38, wherein step (b) includes the steps of:

(c) determining from the predicted film thickness profiles a first one of the source flux and sweep velocity modulation recipes which is predicted to achieve a thickness profile at least approximately matching the selected thickness profile;

(d) performing a vapor deposition operation in which the source deposits a film of the material on a test substrate while the test substrate is swept across the source and the source is operated in accordance with the first one of the source flux and sweep velocity modulation recipes;

(e) generating measured thickness data by measuring thickness as a function of position on the test substrate of the film deposited in step (d); and (f) determining, from the predicted film thickness profiles and the measured thickness data, said one of the source flux and sweep velocity modulation recipes which is adequate to achieve the selected thickness profile.

42. The method of claim 38, wherein step (b) includes the steps of:

(c) determining from the predicted film thickness profiles a first one of the source flux and sweep velocity modulation recipes which is predicted to achieve a thickness profile at least approximately matching the selected thickness profile;

(d) performing a vapor deposition operation in which the source deposits a film of the material on a test substrate while the test substrate is swept across the source and the source is operated in accordance with the first one of the source flux and sweep velocity modulation recipes;

(e) generating measured thickness data by measuring thickness as a function of position on the test substrate of the film deposited in step (d);

(f) determining, from the predicted film thickness profiles and the measured thickness data, a second one of the source flux and sweep velocity modulation recipes which is predicted to achieve another thickness profile at least approximately matching the selected thickness profile;

(g) performing another vapor deposition operation in which the source deposits a film of the material on a second test substrate while the second test substrate is swept across the source and the source is operated in accordance with the second one of the source flux and sweep velocity modulation recipes;

(h) generating additional measured thickness data by measuring thickness as a function of position on the second test substrate of the film deposited in step (g); and (i) determining, from the predicted film thickness profiles and the additional measured thickness data, said one of the source flux and sweep velocity modulation recipes which is adequate to achieve the selected thickness profile.

43. A method for determining a source flux and sweep velocity modulation recipe for achieving a selected thickness profile of a film deposited on a substrate by sweeping said substrate across a vapor deposition source at a sweep velocity determined by said source flux and sweep velocity modulation recipe while operating the source in accordance with said source flux and sweep velocity modulation recipe, wherein the source has a different flux distribution when operated at each of a number of applied power levels, said method including the steps of:

(a) processing source flux and sweep velocity modulation recipe data with data indicative of each said flux distribution to generate a set of predicted thickness profiles of films deposited by the source on a substrate, wherein the source flux and sweep velocity modulation recipe data determines a set of predetermined source flux and sweep velocity modulation recipes, each of the predicted thickness profiles assumes and corresponds to a different one of the source flux and sweep velocity modulation recipes; and (b) determining from the predicted thickness profiles said source flux and sweep velocity modulation recipe for achieving the selected thickness profile.

44. The method of claim 43, wherein each of the predetermined source flux and sweep velocity modulation recipes is a source flux modulation recipe that specifies source flux distribution as a function of time during a time interval in which the substrate sweeps across the source with constant velocity.

45. The method of claim 43, wherein each of the predetermined source flux and sweep velocity modulation recipes specifies source flux distribution as a function of time, and substrate sweep velocity as a function of time, during a time interval in which the substrate sweeps across the source.

46. The method of claim 43, wherein step (a) includes the steps of:

for each of the source flux and sweep velocity modulation recipes, determining the time that each point of a set of points on the substrate spends over each of a set of points of the source during the sweep;

generating a set of product values by multiplying each such time by a rate of film deposition at the corresponding point of the source determined from the data indicative of each flux distribution; and summing the product values to generate, for said each of the source flux and sweep velocity modulation recipes, a set of predicted thickness values comprising a predicted thickness value for each point of the set of points of the substrate.

47. The method of claim 43, wherein the set of predicted thickness profiles generated in step (a) is a set of predicted thickness profiles of films deposited by the source on a flat substrate.

48. The method of claim 43, wherein the set of predicted thickness profiles generated in step (a) is a set of predicted thickness profiles of films deposited by the source on a substrate that is an optic having nonzero curvature.

49. The method of claim 43, wherein the set of predicted thickness profiles generated in step (a) is a set of predicted thickness profiles of films deposited by the source on a substrate that is an optic having a figure to be corrected by deposition of the film on said optic, and wherein the selected thickness profile of the film is such that deposition of the film onto the optic achieves a desired correction of said figure of the optic.

50. The method of claim 43, wherein step (b) includes the steps of:

(c) determining from the predicted thickness profiles a first one of the source flux and sweep velocity modulation recipes which is predicted to achieve a thickness profile at least approximately matching the selected thickness profile;

(d) performing a vapor deposition operation in which the source deposits a film of the material on a test substrate while the test substrate is swept across the source and the source is operated in accordance with the first one of the source flux and sweep velocity modulation recipes;

(e) generating measured thickness data by measuring thickness as a function of position on the test substrate of the film deposited in step (d); and (e determining, from the predicted film thickness profiles and the measured thickness data, said source flux and sweep velocity modulation recipe for achieving the selected thickness profile.

* * * * *